United States Patent
Yang et al.

(10) Patent No.: US 10,698,521 B2
(45) Date of Patent: Jun. 30, 2020

(54) IN-CELL TOUCH DISPLAY PANEL, DRIVING METHOD THEREOF, AND DISPLAY DEVICE

(71) Applicants: BOE Technology Group Co., Ltd., Beijing (CN); Beijing BOE Optoelectronics Technology Co., Ltd., Beijing (CN)

(72) Inventors: Shengji Yang, Beijing (CN); Xue Dong, Beijing (CN); Hailin Xue, Beijing (CN); Haisheng Wang, Beijing (CN); Xiaochuan Chen, Beijing (CN); Xi Chen, Beijing (CN); Jianyun Xie, Beijing (CN); Hongjuan Liu, Beijing (CN); Yingming Liu, Beijing (CN); Weijie Zhao, Beijing (CN); Jiantao Liu, Beijing (CN)

(73) Assignees: BOE Technology Group Co., Ltd., Beijing (CN); Beijing BOE Optoelectronics Technology Co., Ltd., Beijing (CN)

( * ) Notice: Subject to any disclaimer, the term of this patent is extended or adjusted under 35 U.S.C. 154(b) by 65 days.

(21) Appl. No.: 15/110,359

(22) PCT Filed: Nov. 5, 2015

(86) PCT No.: PCT/CN2015/093898
§ 371 (c)(1),
(2) Date: Jul. 7, 2016

(87) PCT Pub. No.: WO2016/206274
PCT Pub. Date: Dec. 29, 2016

(65) Prior Publication Data
US 2017/0147121 A1    May 25, 2017

(30) Foreign Application Priority Data
Jun. 23, 2015 (CN) .......................... 2015 1 0350194

(51) Int. Cl.
*G06F 3/041* (2006.01)
*G09G 3/3233* (2016.01)
(Continued)

(52) U.S. Cl.
CPC ............ *G06F 3/0416* (2013.01); *G06F 3/044* (2013.01); *G06F 3/0412* (2013.01);
(Continued)

(58) Field of Classification Search
CPC ........ G06F 3/044; G06F 3/0412; G06F 3/041; G06F 3/0416; G02F 1/13338
See application file for complete search history.

(56) References Cited

U.S. PATENT DOCUMENTS

| 2011/0109568 A1 | 5/2011 | Wu et al. |
| 2011/0187699 A1* | 8/2011 | Yamashita ........... G09G 3/3233 345/212 |

(Continued)

FOREIGN PATENT DOCUMENTS

CN    104362170 A    2/2015

OTHER PUBLICATIONS

Dec. 19, 2018—(EP) Extended European Search Report Appn 15894514.

*Primary Examiner* — Yuzhen Shen
(74) *Attorney, Agent, or Firm* — Banner & Witcoff, Ltd.

(57) ABSTRACT

The present application provides an in-cell touch display panel, a driving method thereof, and a display device. At least two sub-pixels are a sub-pixel group, cathode layers of different sub-pixel groups are independent of each other, which is equivalent to that the cathode layer set as a whole surface in the prior art is segmented, one sub-pixel group corresponds to one segmented cathode layer, cathode layers of respective sub-pixel groups are connected through conductive lines to the driver chip, so that the cathode layer is (Continued)

reused as a self-capacitive touch control electrode, the driver chip detects a capacitance variation of the cathode layer through the conductive line corresponding thereto to determine a touch location, thus achieving the touch control function. In the in-cell touch display panel, signals outputted by the driver chip to respective signal terminals of a sub-pixel circuit and the cathode layer in a fourth stage are obtained by superimposing the same touch scanning signal on basis of signals outputted to the respective signal terminals and the cathode layer in a third stage, so that the operating state of each module in the sub-pixel circuit is the same as that in the third stage, which ensures normal display, therefore an in-cell touch display panel based on OLED panel is achieved.

17 Claims, 16 Drawing Sheets

(51) Int. Cl.
    *G06F 3/044*    (2006.01)
    *H01L 27/32*    (2006.01)
    *H01L 51/50*    (2006.01)
    *H01L 51/52*    (2006.01)

(52) U.S. Cl.
    CPC ......... *G09G 3/3233* (2013.01); *H01L 27/323* (2013.01); *H01L 27/3246* (2013.01); *H01L 27/3258* (2013.01); *H01L 27/3276* (2013.01); *H01L 51/5012* (2013.01); *H01L 51/5206* (2013.01); *H01L 51/5221* (2013.01); *G06F 2203/04111* (2013.01)

(56) References Cited

U.S. PATENT DOCUMENTS

| | | | |
|---|---|---|---|
| 2014/0313138 A1* | 10/2014 | Jeong | G09G 3/3258 345/173 |
| 2016/0210905 A1* | 7/2016 | Lee | H01L 27/1222 |
| 2016/0225838 A1* | 8/2016 | Im | H01L 27/3276 |
| 2016/0351636 A1* | 12/2016 | Lee | H01L 51/5212 |
| 2016/0358985 A1 | 12/2016 | Bai et al. | |
| 2017/0012056 A1* | 1/2017 | Lee | H01L 27/124 |
| 2017/0090644 A1* | 3/2017 | Yao | G06F 3/0416 |
| 2017/0277295 A1* | 9/2017 | Reynolds | G06F 3/044 |
| 2018/0120995 A1* | 5/2018 | Lee | G06F 3/0412 |
| 2018/0239488 A1* | 8/2018 | Lin | G06F 3/0416 |

* cited by examiner

IN-CELL TOUCH DISPLAY PANEL, DRIVING METHOD THEREOF, AND DISPLAY DEVICE

The application is a U.S. National Phase Entry of International Application No. PCT/CN2015/093898 filed on Nov. 5, 2015, designating the United States of America and claiming priority to Chinese Patent Application No. 201510350194.2 filed Jun. 23, 2015. The present application claims priority to and the benefit of the above-identified applications and the above-identified applications are incorporated by reference herein in their entirety.

TECHNICAL FIELD

The present disclosure relates to a technical field of touch display, and, more particularly, to an in-cell touch display panel, a driving method thereof, and a display device.

BACKGROUND

With the rapid development of display technology, touch screen panel has gradually spread around people's life. Currently, according to composition, touch screen panel can be divided as: add-on mode touch panel, on-cell touch panel, and in-cell touch panel. Among them, the add-on mode touch panel refers to that a touch screen and a display screen are produced separately and then bonded together to become a display screen panel with a touch function, the add-on mode touch panel has disadvantages such as high manufacturing cost, low light transmittance, and thick module. The in-cell touch panel embeds touch electrodes of the touch screen inside the display screen, such that overall thickness of the module can be thinned and manufacturing cost of touch screen panel can be reduced greatly, and thus the in-cell touch panel is favored by a majority of manufacturers.

However, the current in-cell touch panel is mainly adopted in LCD panel. As we all know, OLED (Organic Light Emitting Diode) panel is currently a hot focus in the research field of flat panel display, compared with LCD panel, OLED panel has advantages such as low power consumption, low manufacturing cost, self-luminance, wide viewing angle, and fast response speed. At present, OLED panel has begun to replace the traditional LCD panel in display fields such as mobile phone, PDA, digital camera. Therefore, providing an in-cell touch display panel applicable to OLED panel becomes an urgent problem that needs to be solved by those skilled in the art.

SUMMARY

In view of the above, in embodiments of the present disclosure, an in-cell touch display panel, a driving method thereof, and a display device are proposed for implementing an in-cell touch display panel based on OLED panel.

According to embodiments of the present disclosure, there is provided an in-cell touch display panel, comprising an array substrate and a plurality of sub-pixels arranged on the array substrate, each of the plurality of sub-pixels including an organic light-emitting element, the organic light-emitting element including an anode layer, a light-emitting layer and a cathode layer that are arranged in sequence on the array substrate, wherein at least two sub-pixels are a sub-pixel group, cathode layers pertaining to different sub-pixel groups are independent of each other.

According to an embodiment of the present disclosure, each of the plurality of sub-pixels further includes a sub-pixel circuit electrically connected to the organic light-emitting element, the sub-pixel circuit includes: a data writing module, a compensation module, a reset control module, a light-emitting control module, a driving control module, a data signal terminal, a writing control signal terminal, a reset control signal terminal, a light-emitting control signal terminal, a compensation control signal terminal, a first reference signal terminal, and a second reference signal terminal.

According to an embodiment of the present disclosure, the reset control module is configured to supply, under control of the reset control signal terminal, a signal at the second reference signal terminal to the third node and the anode layer of the organic light-emitting element; the data writing module is configured to supply, under control of the writing control signal terminal, a signal at the data signal terminal to the first node; the light-emitting control module is configured to supply, under control the light-emitting control signal terminal, a signal at the first reference signal terminal to the second node; the compensation module is configured to store a data voltage and a threshold voltage of the driving control module, and supply, under control of the compensation control signal terminal, a signal at the third node to the first node, so as to compensate for an affect of the threshold voltage of the driving control module on a current that flows through the organic light-emitting element; and the driving control module is configured to drive, under common control of the light-emitting control module and the compensation module, the organic light-emitting element to emit light.

According to an embodiment of the present disclosure, the data writing module includes: a first switching transistor having a gate that serves as a control terminal of the data writing module, a source that serves as an input terminal of the data writing module, and a drain that serves as an output terminal of the data writing module; the driving control module includes: a driving transistor having a gate that serves as a control terminal of the driving control module, a source that serves as an input terminal of the driving control module, and a drain that serves as an output terminal of the driving control module.

According to an embodiment of the present disclosure, the reset control module includes a second switching transistor and a third switching transistor; a gate of the second switching transistor is connected to a gate of the third switching transistor and serves as a control terminal of the reset control module, a source of the second switching transistor serves as an input terminal of the reset control module, and a drain of the second switching transistor serves as a first output terminal of the reset control module; a source of the third switching transistor serves as the input terminal of the reset control module, and a drain of the third switching transistor serves as a second output terminal of the reset control module; the light-emitting control module includes: a fifth switching transistor having a gate that serves as a control terminal of the light-emitting control module, a source that serves as an input terminal of the light-emitting control module, a drain that serves as an output terminal of the light-emitting control module.

According to an embodiment of the present disclosure, the compensation module includes: a fourth switching transistor and a capacitor; a gate of the fourth switching transistor serves as a control terminal of the compensation module, a source thereof is connected to one terminal of the capacitor and serves as a second input terminal of the compensation module, and a drain thereof serves as an output terminal of the compensation module; the other terminal of the capacitor serves as a first input terminal of the compensation module.

In the in-cell touch display panel provided above in the embodiments of the present disclosure, all of the switching transistors are N-type transistors or all of the switching transistors are P-type transistors.

In the in-cell touch display panel provided above by the embodiments of the present disclosure, the sub-pixel circuit is located between the anode layer and the array substrate; the array substrate further includes data lines that connect data signal terminals in the respective sub-pixel circuits to a driver chip and conductive lines that connect the cathode layers of the respective sub-pixel groups to the driver chip; and the conductive lines and the data lines are disposed in a same layer but insulated from each other.

In the in-cell touch display panel provided above by the embodiments of the present disclosure, each of the transistors in the sub-pixel circuit includes an active layer, a gate insulating layer, a gate, an insulating layer, a source, and a drain that are arranged in sequence on the array substrate; the data line is disposed in the same layer as the source and the drain; and the conductive line is connected to the cathode layer corresponding thereto through a via hole.

Preferably, in the in-cell touch display panel provided above by the embodiments of the present disclosure, each of the sub-pixel circuits further comprises: a planarization layer located between a layer where the source and the drain reside and the anode layer, a sub-pixel defining layer located between the cathode layer and the planarization layer and surrounding each light-emitting layer, and a cathode connecting section disposed in the same layer as the anode layer; wherein the cathode connecting section is connected to the conductive line corresponding thereto through a via hole that penetrates through the planarization layer, the cathode layer is connected to the cathode connecting section corresponding thereto through a via hole that penetrates through the sub-pixel defining layer.

In the in-cell touch display panel provided above by the embodiments of the present disclosure, each sub-pixel is of a hexagonal shape, and all the sub-pixels are arranged regularly on the array substrate; the respective sub-pixels are arranged side by side in a row direction, the sub-pixels at corresponding positions in two adjacent rows of sub-pixels show a misaligned arrangement in a column direction, and in each row of sub-pixels, a via hole for connecting the cathode layer and the conductive line is disposed between two adjacent sub-pixels, and a via hole for connecting the anode layer and the drain is disposed in a gap between two adjacent rows of sub-pixels; or the respective sub-pixels are arranged side by side in a column direction, the sub-pixels at corresponding positions in two adjacent columns of sub-pixels show a misaligned arrangement in a row direction, and in each column of sub-pixels, a via hole for connecting the cathode layer and the conductive line is disposed between two adjacent sub-pixels, and a via hole for connecting the anode layer and the drain is disposed in a gap between two adjacent columns of sub-pixels.

Correspondingly, according to an embodiment of the present disclosure, there is further provided a display device comprising any of the in-cell touch display panel provided above in the embodiments of the present disclosure.

Correspondingly, according to an embodiment of the present disclosure, there is further provided a driving method for any of the in-cell touch display panel provided above, as for each sub-pixel, within one frame:

in a first stage, the reset control module supplies a signal at the second reference signal terminal to the third node and the anode layer of the organic light-emitting element under control of a reset control signal; the data writing module supplies a signal at the data signal terminal to the first node under control of a writing control signal; the light-emitting control module charges the compensation module under control a light-emitting control signal;

in a second stage, the data writing module supplies a signal at the data signal terminal to the first node under control of the writing control signal; the reset control module supplies a signal at the second reference signal terminal to the third node and the anode layer of the organic light-emitting element under control of the reset control signal terminal; the light-emitting control module makes the second node in a floating state, so that the compensation module is discharged under control of the first node and the second node, to store a data signal and a threshold voltage of a driving transistor in the driving control module;

in a third stage, the light-emitting control module supplies a signal at the first reference signal terminal to the second node under control of the light-emitting control signal; the reset control module makes the third node in a floating state; the data writing module enables the first node and the data signal terminal to be disconnected; the compensation module supplies a signal at the third node to the first node under control of a compensation control signal; the driving control module drives the organic light-emitting element to emit light under common control of the light-emitting control module and the compensation module; and in a fourth stage, the driver chip outputs a first reference signal superimposed with a touch scanning signal to the first reference signal terminal, and output a third reference signal superimposed with the touch scanning signal to the cathode layer, an operating state of each module of the sub-pixel circuit is the same as that in the third stage, and the driver chip detects a capacitance variation of the cathode layer through the conductive line corresponding thereto to determine a touch location.

In the in-cell touch display panel, the driving method thereof, and the display device provided above by the embodiments of the present disclosure, at least two sub-pixels are a sub-pixel group, cathode layers of different sub-pixel groups are independent of each other, which is equivalent to that the cathode layer set as a whole surface in the prior art is segmented, one sub-pixel group corresponds to one segmented cathode layer, cathode layers of respective sub-pixel groups are connected through conductive lines to the driver chip, so that the cathode layer is reused as a self-capacitive touch control electrode, the driver chip detects a capacitance variation of the cathode layer through the conductive line corresponding to the cathode layer to determine a touch location, thus achieving the touch control function. In the in-cell touch display panel, the signals outputted by the driver chip to the respective signal terminals of the sub-pixel circuit and the cathode layer in the fourth stage are obtained by superimposing the same touch scanning signal on basis of the signals outputted to the respective signal terminals and the cathode layer in the third stage, so that the operating states of the respective modules in the sub-pixel circuit are the same as those of the respective modules in the sub-pixel circuit in the third stage (i.e., the light-emitting display stage), which ensures normal display, therefore, an in-cell touch display panel based on OLED panel is achieved.

DETAILED DESCRIPTION OF THE EMBODIMENTS

Figure 1:
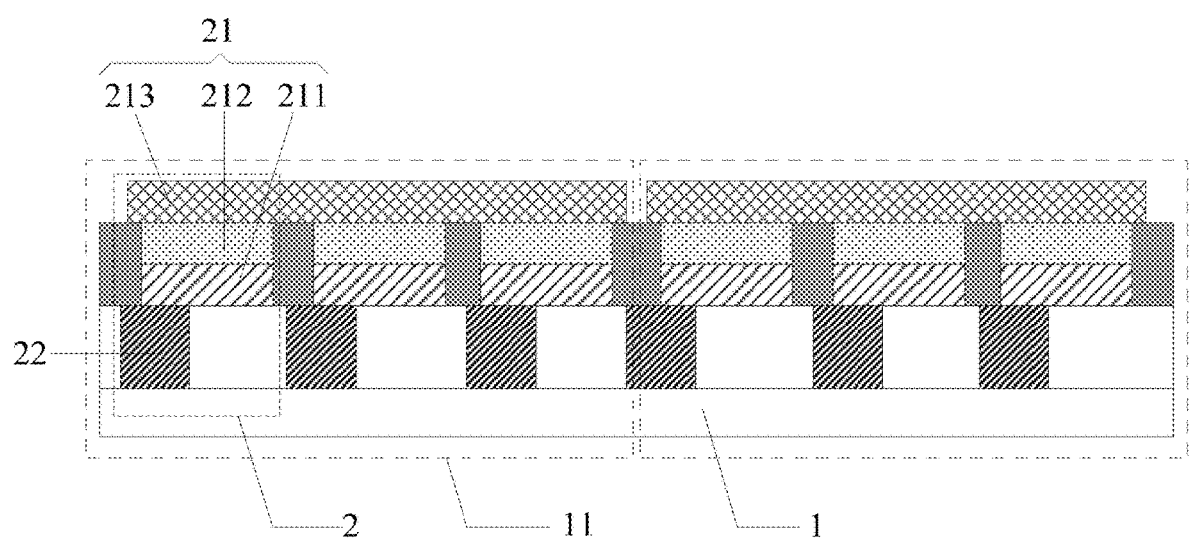
FIG. 1 is a schematic diagram of structure of an in-cell touch display panel provided by an embodiment of the present disclosure.

Hereinafter, the in-cell touch display panel, the driving method thereof, and the display device provided by the embodiments of the present disclosure will be described in detail in conjunction with concrete implementations.

Thickness and shape of respective layers in the drawings do not reflect a true scale, and they are only intended to illustrate content of the present disclosure.

Figure 3:
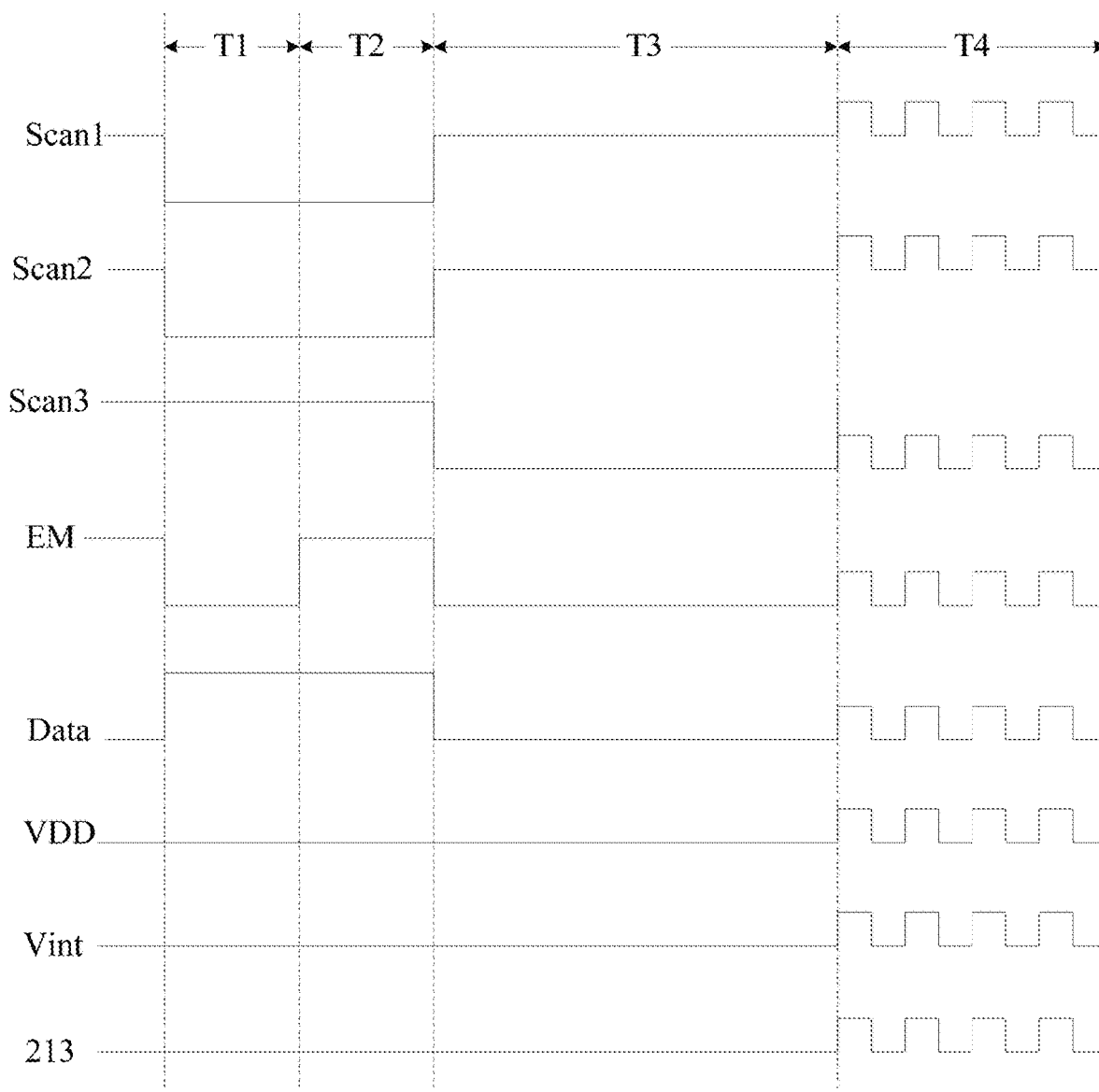
FIG. 3 is a schematic diagram of waveform of signals outputted by a driver chip to respective signal terminals of the sub-pixel circuit and the cathode layer within one frame.

According to the embodiments of the present disclosure, there is provided an in-cell touch display panel, as shown in FIG. 1, the in-cell touch display panel comprises an array substrate 1 and a plurality of sub-pixels 2 arranged on the array substrate 1, each sub-pixel 2 includes an organic light-emitting element 21 and a sub-pixel circuit 22 (concrete structure of the sub-pixel circuit is not shown in FIG. 1) connected to the organic light-emitting element 21, wherein the organic light-emitting element 21 includes an anode layer 211, a light-emitting layer 212 and a cathode layer 213 that are arranged in sequence on the array substrate 1, at least two sub-pixels 2 are a sub-pixel group 11, cathode layers 213 pertaining to different sub-pixel groups 11 are independent of each other. In addition, the in-cell touch display panel further comprises: a driver chip configured to output signals to respective signal terminals of each sub-pixel circuit 22 and the cathode layer 213 of each sub-pixel group (the driver chip is not shown in FIG. 1, but a schematic diagram of waveform of signals outputted by the driver chip to respective signal terminals of the sub-pixel circuit and the cathode layer within one frame is as shown in FIG. 3).

Figure 2:
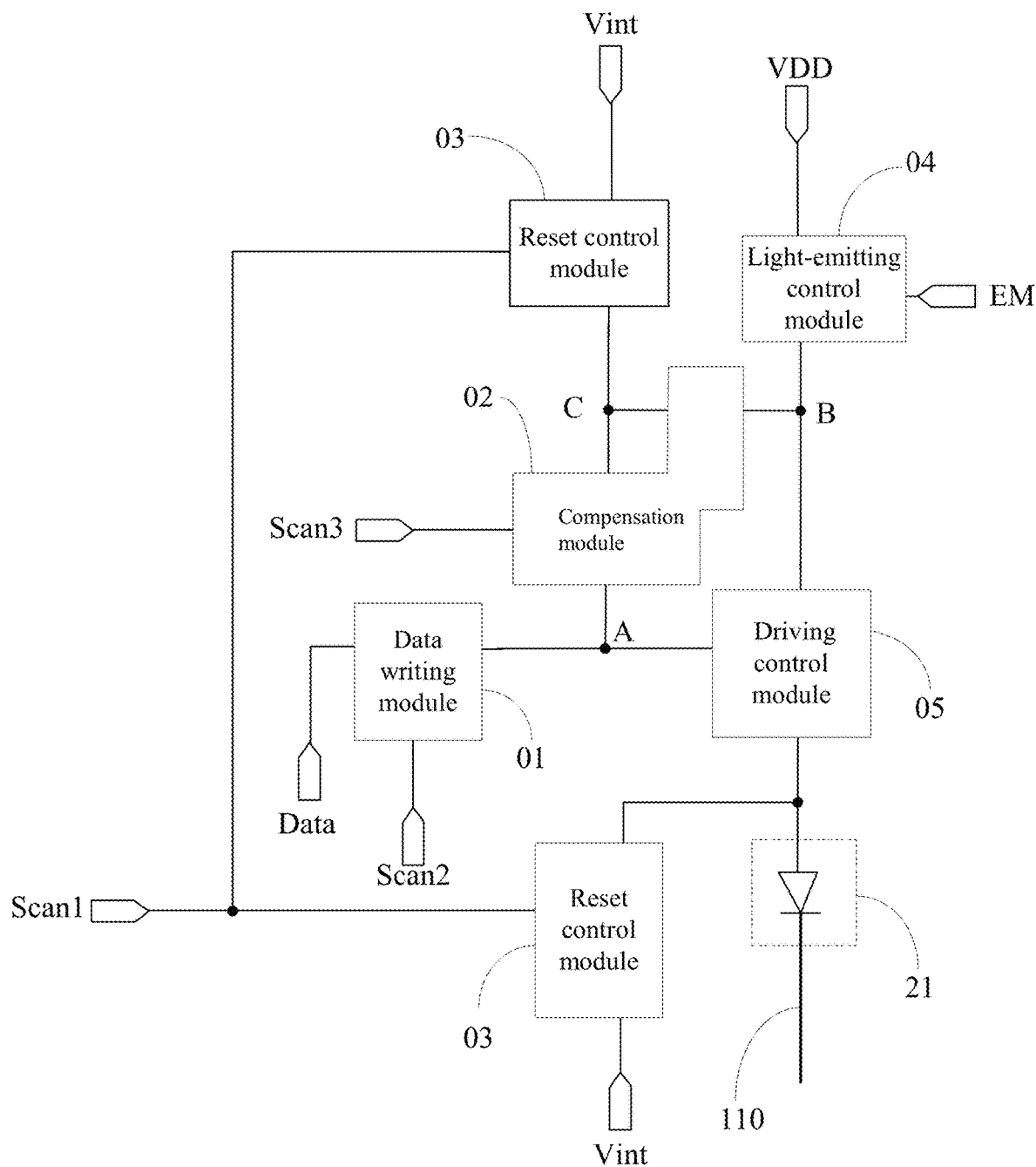
FIG. 2 is a schematic diagram of structure of a sub-pixel circuit provided by an embodiment of the present disclosure.

As shown in FIG. 2, each sub-pixel circuit includes: a data writing module 01, a compensation module 02, a reset control module 03, a light-emitting control module 04, a driving control module 05, a data signal terminal Data, a writing control signal terminal Scan2, a reset control signal terminal Scan1, a light-emitting control signal terminal EM, a compensation control signal terminal Scan3, a first reference signal terminal VDD, and a second reference signal terminal Vint.

An input terminal of the data writing module 01 is connected to the data signal terminal Data, a control terminal thereof is connected to the writing control signal terminal Scan2, and an output terminal thereof is connected to a first node A; an input terminal of the light-emitting control module 04 is connected to the first reference signal terminal VDD, a control terminal thereof is connected to the light-emitting control terminal EM, and an output terminal thereof is connected to a second node B; an input terminal of the reset control module 03 is connected to the second reference signal terminal Vint, a control terminal thereof is connected to the reset control signal terminal Scan1, a first output terminal thereof is connected to a third node C, and a second output terminal thereof is connected to an output terminal of the driving control module 05 and the anode layer 211 of the organic light-emitting element 21 corresponding thereto; a first input terminal of the compensation module 02 is connected to the second node B, a second input terminal thereof is connected to the third node C, a control terminal thereof is connected to the compensation control signal terminal Scan3, and an output terminal thereof is connected to the first node A; an input terminal of the driving control module 05 is connected to the second node B, a control terminal thereof is connected to the first node A; the cathode layer 213 of each sub-pixel group 11 is connected to the driver chip through a conductive line 110 corresponding thereto.

The reset control module 03 is configured to supply, under control of the reset control signal terminal Scan1, a signal at the second reference signal terminal Vint to the third node C and the anode layer 211 of the organic light-emitting element 21; the data writing module 01 is configured to supply, under control of the writing control signal terminal Scan2, a signal at the data signal terminal Data to the first node A; the compensation module 02 is configured to be charged or discharged according to on or off state of the reset control module 03 and the light-emitting control module 04 and to maintain a voltage difference between the second node B and the third node C as a fixed value when the third node C is in a floating state, i.e., store a data voltage and a threshold voltage of the driving control module, and supply, under control of the compensation control signal terminal Scan3, a signal at the third node C to the first node A; the light-emitting control module 04 is configured to supply, under control the light-emitting control signal terminal EM, a signal at the first reference signal terminal VDD to the second node B; and the driving control module 05 is configured to drive, under common control of the light-emitting control module 04 and the compensation module 02, the organic light-emitting element 21 to emit light.

As for each sub-pixel, taking that of each control signal terminal of the sub-pixel circuit is at an effective control level as an example, as shown in FIG. 3, the driver chip is configured to, within one frame: in a first stage T1, output a light-emitting control signal to the light-emitting control signal terminal EM of the sub-pixel circuit 22 in the sub-pixel 2, output a reset control signal to the reset control signal terminal Scan1, output a writing control signal to the writing control signal terminal Scan2, and output a data signal to the data signal terminal Data; in a second stage T2, output a reset control signal to the reset control signal terminal Scan1, output a writing control signal to the writing control signal terminal Scan2, and output a data signal to the data signal terminal Data; in a third stage T3, output a light-emitting control signal to the light-emitting control signal terminal EM, output a compensation control signal to the compensation control signal terminal Scan3; output a first reference signal to the first reference signal terminal VDD and output a second reference signal to the second reference signal terminal Vint in the first stage T1 through the third stage T3, and output, through the conductive line 110 corresponding thereto, a third reference signal to the cathode layer 213 of the organic light-emitting element 21 in the sub-pixel 2; and in a fourth stage T4, output signals to the respective signal terminals (Scan1, Scan2, Scan3, Vint, Data, EM, and VDD) of the sub-pixel circuit 22 and the cathode layer 213, the signals being obtained by superimposing the same touch scanning signal on basis of the signals outputted to the respective signal terminals and the cathode layer 213 in the third stage, so that operating states of the respective modules in the sub-pixel circuit 22 in the fourth stage T4 are the same as those of the respective modules in the sub-pixel circuit 22 in the third stage T3, and detect, through the conductive line 110 corresponding thereto, a capacitance variation of the cathode layer 213 to determine a touch location.

In the in-cell touch display panel provided above by the embodiments of the present disclosure, at least two sub-pixels are a sub-pixel group, cathode layers of different sub-pixel groups are independent of each other, which is equivalent to that the cathode layer set as a whole surface in the prior art is segmented, one sub-pixel group corresponds to one segmented cathode layer, the cathode layers of the respective sub-pixel groups are connected through conductive lines to the driver chip, so that the cathode layer is reused as a self-capacitive touch control electrode, the driver chip applies, through the conductive line, a touch scanning signal to the cathode layer and detects, through the conductive line, a capacitance variation of the cathode layer to determine a touch location, thus achieving the touch control function. In addition, in the in-cell touch display panel, the signals outputted by the driver chip to the respective signal terminals of the sub-pixel circuit and the cathode layer in the fourth stage are obtained by superimposing the same touch scanning signal on basis of the signals outputted to the respective signal terminals and the cathode layer in the third stage, so that the operating states of the respective modules in the sub-pixel circuit are the same as those of the respective modules in the sub-pixel circuit in the third stage (i.e., the light-emitting display stage), which ensures normal display, therefore, an in-cell touch display panel based on OLED panel is achieved.

It needs to be noted that, in the in-cell touch display panel provided above by the embodiments of the present disclosure, the operating state of a module refers to that a transistor in the module is in a turned-on state or a turned-off state. The operating state of each module of the sub-pixel circuit in the fourth stage is the same as the operating state of each module of the sub-pixel circuit in the third stage refers to that, with the light-emitting control module as an example, if a transistor in the light-emitting control module is in an on state in the third stage, then it is also in an on state in the fourth stage.

According to the principle of self-capacitive touch control, when a human body does not touch a screen, each self-capacitive electrode is subjected to a fixed capacitance value, when the human body touches the screen, the corresponding self-capacitive electrode is subjected to a fixed capacitance value superimposed with a human body capacitance, a touch detection chip can determine a touch location by detecting variation of the capacitance value of each self-capacitance electrode within a touch period. Therefore, in the in-cell touch display panel provided above, it needs to ensure that the capacitance to which each self-capacitive electrode, i.e., the cathode layer of each sub-pixel group, is subjected in the fourth stage is a fixed capacitance value, which requires that a voltage difference between each cathode layer and a corresponding ground electrode (i.e., another electrode other than the cathode layer) is always maintained consistent. Accordingly, the signals outputted to the respective signal terminals of the sub-pixel circuit and the cathode layer in the fourth stage are obtained by superimposing the same touch scanning signal on basis of the signals outputted to the respective signal terminals and the cathode layer in the third stage, so as to ensure accuracy of touch determination.

Further, in the in-cell touch display panel provided above, by means of cooperation of the respective modules in the sub-pixel circuit, when the organic light-emitting device emits light for display, its driving current is primarily decided by a voltage at the data signal terminal independent of the threshold voltage of the driving transistor in the driving control module, which can avoid an affect of the threshold voltage of the driving control module on the driving current that flows through the organic light-emitting element, so that an operating current that drives the light-emitting device to emit light maintains consistent, which can improve uniformity of image luminance in a display area of a display device.

The present disclosure will be explained in detail below in conjunction with specific embodiments. It needs to be noted that, these embodiments are to explain the present disclosure better, rather than to limit the present disclosure.

Figure 4:
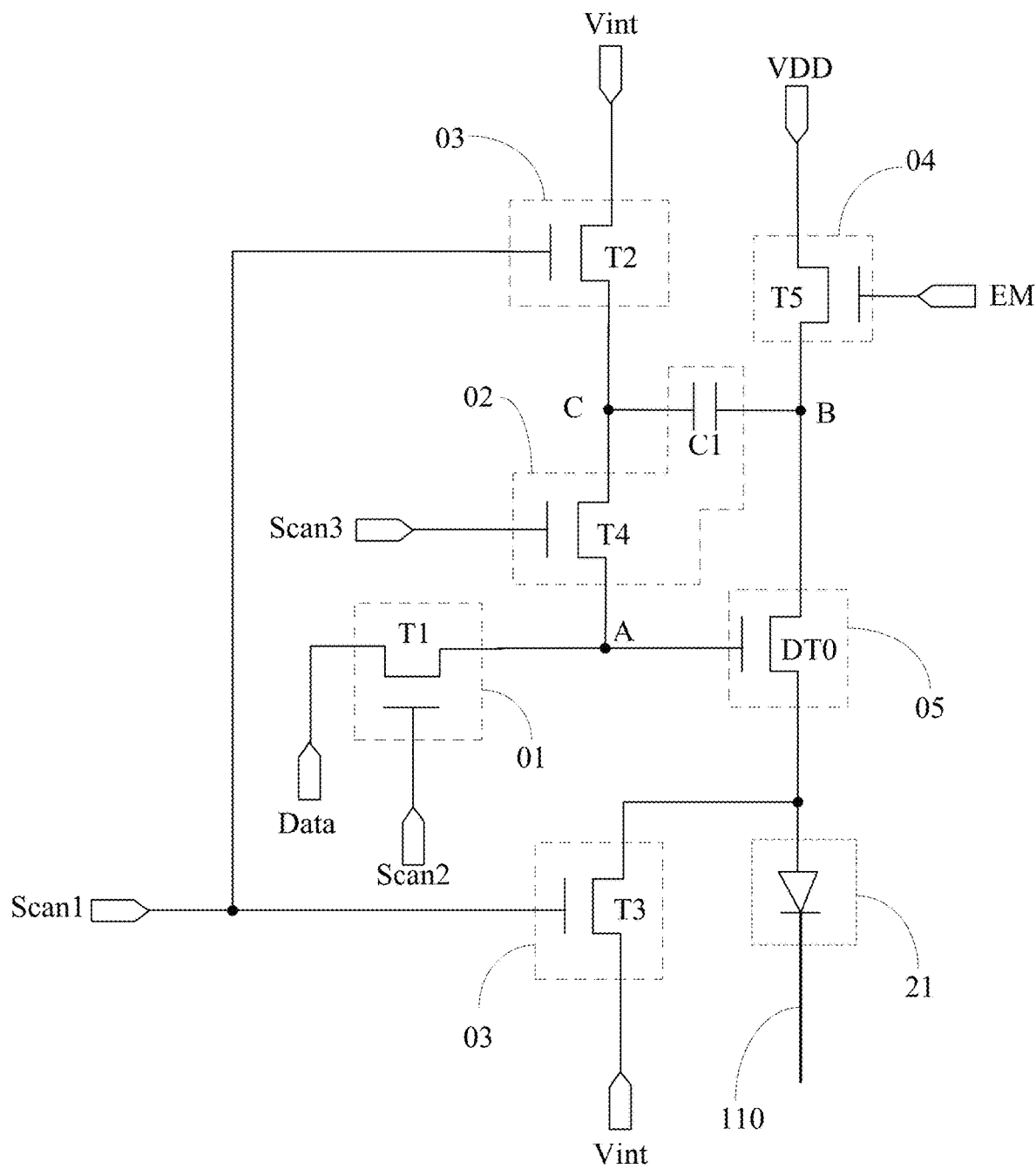
FIG. 4 is a schematic diagram of concrete structure of a sub-pixel circuit provided by an embodiment of the present disclosure.

Preferably, in the in-cell touch display panel provided above by an embodiment of the present disclosure, as shown in FIG. 4, the data writing module 01 may specifically include a first switching transistor T1 having a gate that serves as the control terminal of the data writing module 01, a source that serves as the input terminal of the data writing module 01, and a drain that serves as the output terminal of the data writing module 01.

In a specific implementation, when the first switching transistor T1 is in a turned-on state under control of the writing control signal terminal Scan2, a signal at the data signal terminal Data is supplied to the first node A through the first switching transistor T1.

In a specific implementation, the first switching transistor may be a P-type transistor, or an N-type transistor, no limitations are made herein.

The above is merely an example for explaining the concrete structure of the data writing module in the in-cell touch display panel, in a specific implementation, the concrete structure of the data writing module is not limited to the above structure provided by the embodiments of the present disclosure, it may also be other structures knowable for those skilled in the art, no limitations are made herein.

Preferably, in the in-cell touch display panel provided above by an embodiment of the present disclosure, as shown in FIG. 4, the driving control module 05 may specifically include: a driving transistor DT0 having a gate that serves as the control terminal of the driving control module 05, a source that serves as the input terminal of the driving control module 05, and a drain that serves as the output terminal of the driving control module 05.

Further, in a specific implementation, in the in-cell touch display panel provided above by an embodiment of the present disclosure, the driving transistor DT0 is typically a P-type transistor. A threshold voltage of the P-type transistor usually is a negative value. Correspondingly, a voltage of the first reference voltage usually is a positive value, and a voltage of the third reference signal received by the cathode layer usually is grounded or is a negative value.

The above is merely an example for explaining the concrete structure of the driving control module in the in-cell touch display panel, in a specific implementation, the concrete structure of the driving control module is not limited to the above structure provided by the embodiments of the present disclosure, it may also be other structures knowable for those skilled in the art, no limitations are made herein.

Preferably, in the in-cell touch display panel provided above by an embodiment of the present disclosure, as shown in FIG. 4, the reset control module 03 may specifically include a second switching transistor T2 and a third switching transistor T3; a gate of the second switching transistor T2 is connected to a gate of the third switching transistor and serves as the control terminal of the reset control module 03, a source of the second switching transistor T2 serves as the input terminal of the reset control module 03, and a drain of the second switching transistor T2 serves as the first output terminal of the reset control module 03; a source of the third switching transistor T3 serves as the input terminal of the reset control module 03, and a drain of the third switching transistor T3 serves as the second output terminal of the reset control module 03.

In a specific implementation, when the second switching transistor T2 and the third switching transistor T3 are in a turned-on state under control of the reset control signal terminal Scan1, the turned-on second switching transistor T2 supplies a signal at the second reference signal terminal Vint to the third node C, and the turned-on third switching transistor T3 supplies a signal at the second reference signal terminal Vint to the output terminal of the driving control module 05.

In a specific implementation, the second switching transistor T2 and the third switching transistor T3 may be a P-type transistor each or an N-type transistor each, no limitations are made herein.

The above is merely an example for explaining the concrete structure of the reset control module in the in-cell touch display panel, in a specific implementation, the concrete structure of the reset control module is not limited to the above structure provided by the embodiments of the present disclosure, it may also be other structures knowable for those skilled in the art, no limitations are made herein.

Further, in the in-cell touch display panel provided above by an embodiment of the present disclosure, when the data writing module includes the first switching transistor, the reset control module includes the second switching transistor and the third switching transistor, the first switching transistor, the second switching transistor and the third switching transistor may be an N-type transistor each or may be a P-type transistor each, no limitations are made herein.

Preferably, in the in-cell touch display panel provided above by an embodiment of the present disclosure, when the first switching transistor, the second switching transistor and the third switching transistor are an N-type transistor each or a P-type transistor each, the reset control signal terminal and the writing control signal terminal in the sub-pixel circuit are the same signal terminal.

Preferably, in the in-cell touch display panel provided above by an embodiment of the present disclosure, as shown in FIG. 4, the compensation module 02 may specifically include: a fourth switching transistor T4 and a capacitor C1; wherein a gate of the fourth switching transistor T4 serves as the control terminal of the compensation module 02, a source thereof is connected to one terminal of the capacitor C1 and serves as the second input terminal of the compensation module 02, and a drain thereof serves as the output terminal of the compensation module 02; the other terminal of the capacitor C1 serves as the first input terminal of the compensation module 02.

In a specific implementation, the capacitor C1 is charged or discharged according to a turn-on state/turned-off state of the second switching transistor T2 in the reset control module 03 and the light-emitting control module 04, when the second node B is in a floating state (i.e., the light-emitting control module 04 outputs no signal to the second node B) and the driving transistor DT0 is turned on, the capacitor C1 is discharged until a level at the second node B reduces to turn off the driving transistor DT0; thereafter when the third node C is in a floating state (i.e., the second switching transistor T2 in the reset control module 03 outputs no signal to the third node C), a voltage difference between the second node B and the third node C is maintained as a fixed value; and when the fourth switching transistor T4 is in a turned-on state under control of the compensation control signal terminal Scan3, the turned-on fourth transistor T4 supplies a signal at the third node C to the first node A.

In a specific implementation, the fourth switching transistor T4 may be a P-type transistor, or an N-type transistor, no limitations are made herein.

The above is merely an example for explaining the concrete structure of the compensation module in the in-cell touch display panel, in a specific implementation, the concrete structure of the compensation module is not limited to the above structure provided by the embodiments of the present disclosure, it may also be other structures knowable for those skilled in the art, no limitations are made herein.

Further, in the in-cell touch display panel provided above by an embodiment of the present disclosure, the voltage at the second reference signal terminal from the first stage to the third stage may be the same as the voltage at the cathode layer, no limitations are made herein.

Further, in the in-cell touch display panel provided above by an embodiment of the present disclosure, when the first switching transistor, the second switching transistor and the third switching transistor are an N-type transistor each, and the fourth switching transistor is a P-type transistor, the reset control signal terminal, the writing control signal terminal and the compensation control signal terminal in the sub-pixel circuit may be the same signal terminal; alternatively, when the first switching transistor, the second switching transistor and the third switching transistor are a P-type transistor each, and the fourth switching transistor is an N-type transistor, the reset control signal terminal, the writing control signal terminal and the compensation control signal terminal in the sub-pixel circuit may be the same signal terminal.

Preferably, in the in-cell touch display panel provided above by an embodiment of the present disclosure, as shown in FIG. 4, the light-emitting control module 04 may specifically include: a fifth switching transistor T5 having a gate that serves as the control terminal of the light-emitting control module 04, a source that serves as the input terminal of the light-emitting control module 04 and a drain that serves as the output terminal of the light-emitting control module 04.

In a specific implementation, when the fifth switching transistor T5 is in a turned-on state under control of the light-emitting control signal terminal EM, a signal at the first reference signal terminal VDD is delivered to the second node B through the turned-on fifth switching transistor T5.

In a specific implementation, the fifth switching transistor T5 may be a P-type transistor or an N-type transistor, no limitations are made herein.

It needs to be noted that, the driving transistor and the switching transistors mentioned in the above embodiments of the present disclosure may be thin film transistor (TFT), and may also be metal oxide semiconductor field effect transistors (MOSFET), no limitations are made herein.

Preferably, to simplify manufacturing process, in the sub-pixel circuit provided above in the embodiments of the present disclosure, all the switching transistors may be P-type transistors or may be N-type transistors, no limitations are made here.

Preferably, to simplify manufacturing process, in the sub-pixel circuit provided above in the embodiments of the present disclosure, since the driving transistor is a P-type transistor, thus all the switching transistors adopt a design of the P-type transistor, that is, all the transistors are P-type transistors, in this way, manufacturing process of the sub-pixel circuit can be simplified.

Next, with the sub-pixel circuit shown in FIG. 4 as an example, an operating process of the sub-pixel circuit provided by the embodiments of the present disclosure will be described, wherein in FIG. 4, the driving transistor DT0 and all the switching transistors (T1, T2, T3, T4, and T5) are a P-type transistor each, the P-type transistor is in a turned-on state when its gate level is a low level and is in a turned-off state when its gate level is a high level, a corresponding input timing sequence diagram is as shown in FIG. 3. For illustrative purposes, in the following description, 1 represents a high level signal and 0 represents a low level signal. Herein, it is assumed that from the first stage to the third stage, a voltage of the first reference signal outputted by the driver chip to the first reference signal terminal VDD is $V_{dd}$, a voltage of the second reference signal outputted by the driver chip to the second reference signal terminal Vint is $V_{ss}$, a voltage of the third reference signal outputted by the driver chip to the cathode layer 213 is $V_{ss}$, an amplitude of the touch scanning signal superimposed in the fourth stage is $|\Delta V|$.

First Embodiment

In the first stage T1 (resetting and charging stage), Scan1=0, Scan2=0, Scan3=1, EM=0.

Figure 5A:
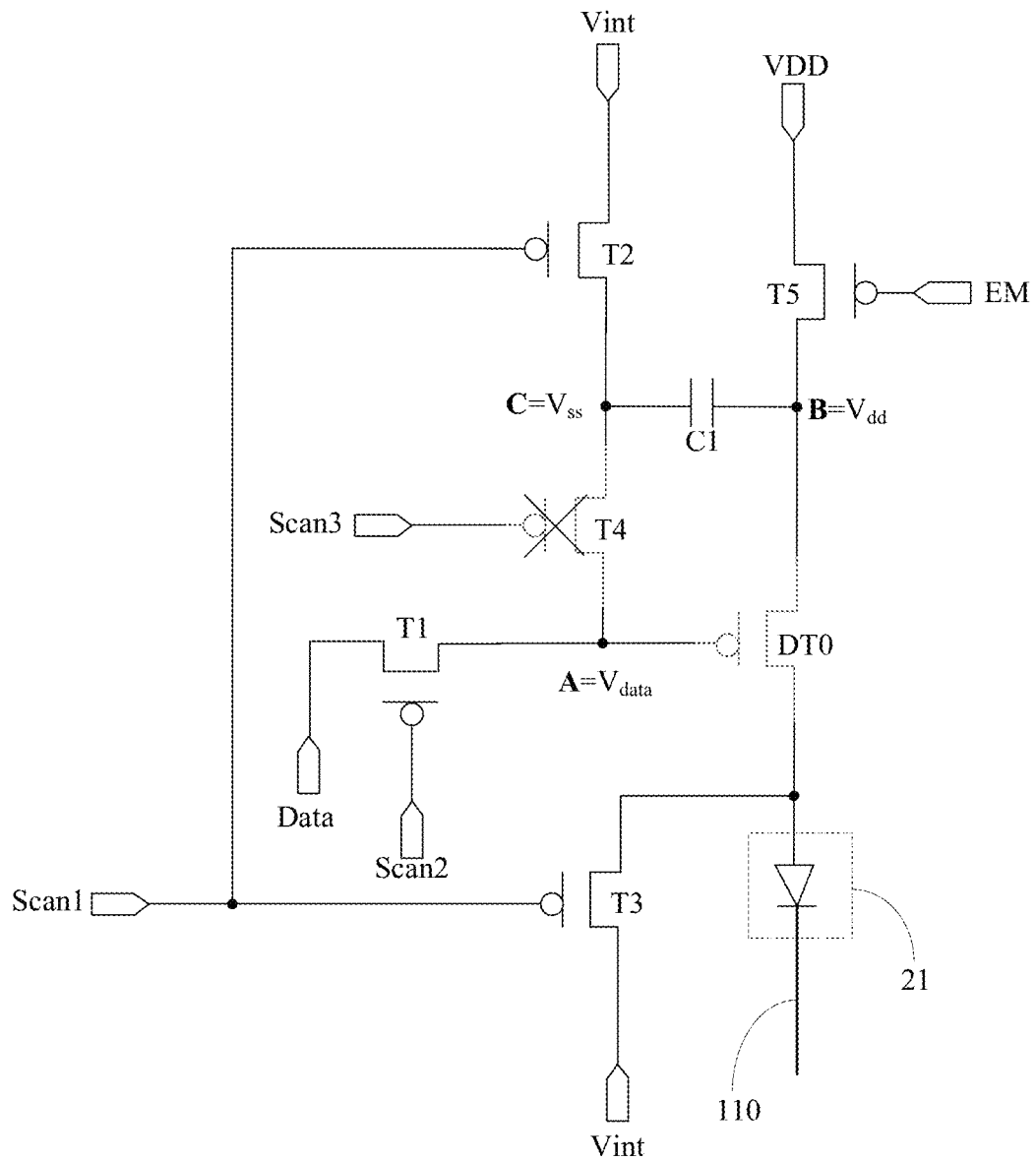
FIGS. 5a to 5d are each a schematic diagram of operating state of a sub-pixel circuit in each stage provided by a first embodiment of the present disclosure.

As shown in FIG. 5a, the first switching transistor T1, the second switching transistor T2, the third switching transistor T3 and the fifth switching transistor T5 are in a turned-on state, and the fourth switching transistor T4 is in a turned-off state. The first reference signal at the first reference signal terminal VDD is delivered to the second node B through the turned-on fifth switching transistor T5, the second reference signal at the reference signal terminal Vint is delivered to the third node C through the turned-on second switching transistor T2, so that a voltage at the third node is a voltage $V_{ss}$ of the second reference signal, the capacitor C1 begins to be charged. The second reference signal at the second reference signal terminal Vint is delivered to the anode layer 211 of the organic light-emitting device 21 through the turned-on third switching transistor T3, so that a voltage of the anode layer 211 of the organic light-emitting device 21 is a voltage $V_{ss}$ of the second reference signal. The data signal at the data signal terminal Data is delivered to the first node A through the turned-on first switching transistor T1, so that a voltage at the first node A is a voltage $V_{data}$ of the data signal. When the voltage at the second node B increases to $V_{data}-V_{th0}$ ($V_{th0}$ is the threshold voltage of the driving transistor DT0, and $V_{th0}<0$), the driving transistor DT0 starts to be turned on, when the first stage T1 ends, the voltage at the second node B is a voltage $V_{dd}$ of the first reference signal, a voltage difference between two terminals of the capacitor C1 is $VBC=V_{dd}-V_{ss}$, $V_{dd}>V_{data}-V_{th0}$.

In the second stage (discharging stage), Scan1=0, Scan2=0, Scan3=1, EM=1.

Figure 5B:
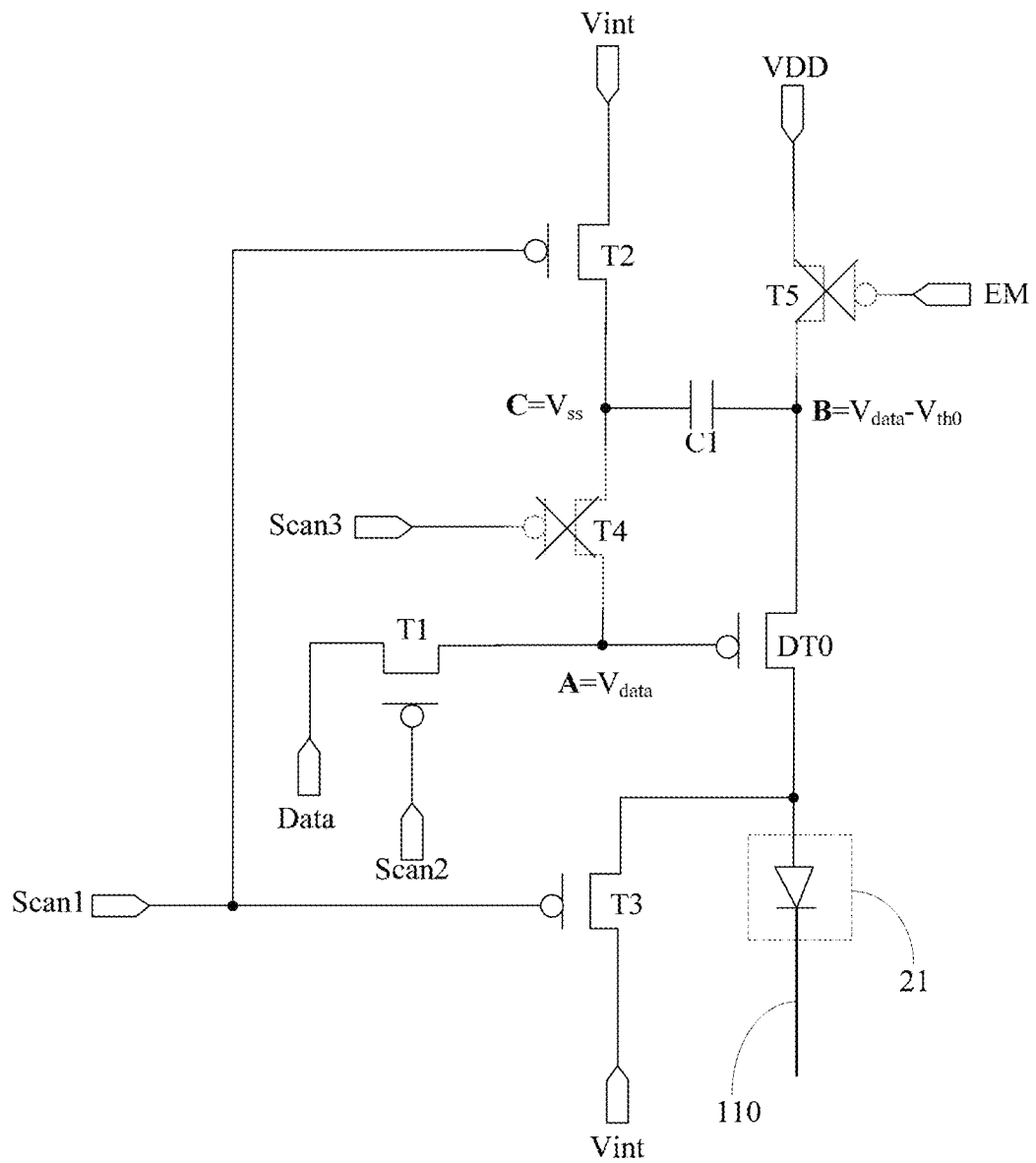

As shown in FIG. 5b, the first switching transistor T1, the second switching transistor T2 and the third switching transistor T3 are in a turned-on state, the fourth switching transistor T4 and the fifth switching transistor T5 are in a turned-off state. The second reference signal at the second reference signal terminal Vint is delivered to the third node C through the turned-on second switching transistor T2, so that a voltage at the third node C is a voltage $V_{ss}$ of the second reference signal, the fifth switching transistor T5 is in a turned-off statue, so that the second node B is floating. The second reference signal at the second reference signal terminal Vint is delivered to the anode layer 211 of the organic light-emitting device 21 through the turned-on third switching transistor T3, so that a voltage of the anode layer 211 of the organic light-emitting device 21 is a voltage $V_{ss}$ of the second reference signal. The data signal at the data signal terminal Data is delivered to the first node A through the turned-on first switching transistor T1, so that a voltage at the first node A is a voltage $V_{data}$ of the data signal. When the second stage T2 starts, a gate voltage of the driving transistor DT0 is $V_{data}$, a source voltage of the driving transistor DT0 is $V_{dd}$, a drain voltage of the driving transistor DT0 is $V_{ss}$, the driving transistor DT0 is turned on, the capacitor C1 starts to be discharged, until the voltage at the second node B becomes $V_{data}-V_{th0}$ ($V_{th0}$ is the threshold voltage of the driving transistor DT0), the driving transistor DT0 is turned off, so that discharging of the capacitor C1 stops. Accordingly, when the second stage T2 ends, a voltage difference between two terminals of the capacitor C1 is $VBC=V_{data}-V_{th0}-V_{ss}$.

In the third stage T3 (light-emitting display stage), Scan1=1, Scan2=1, Scan3=0, EM=0.

Figure 5C:
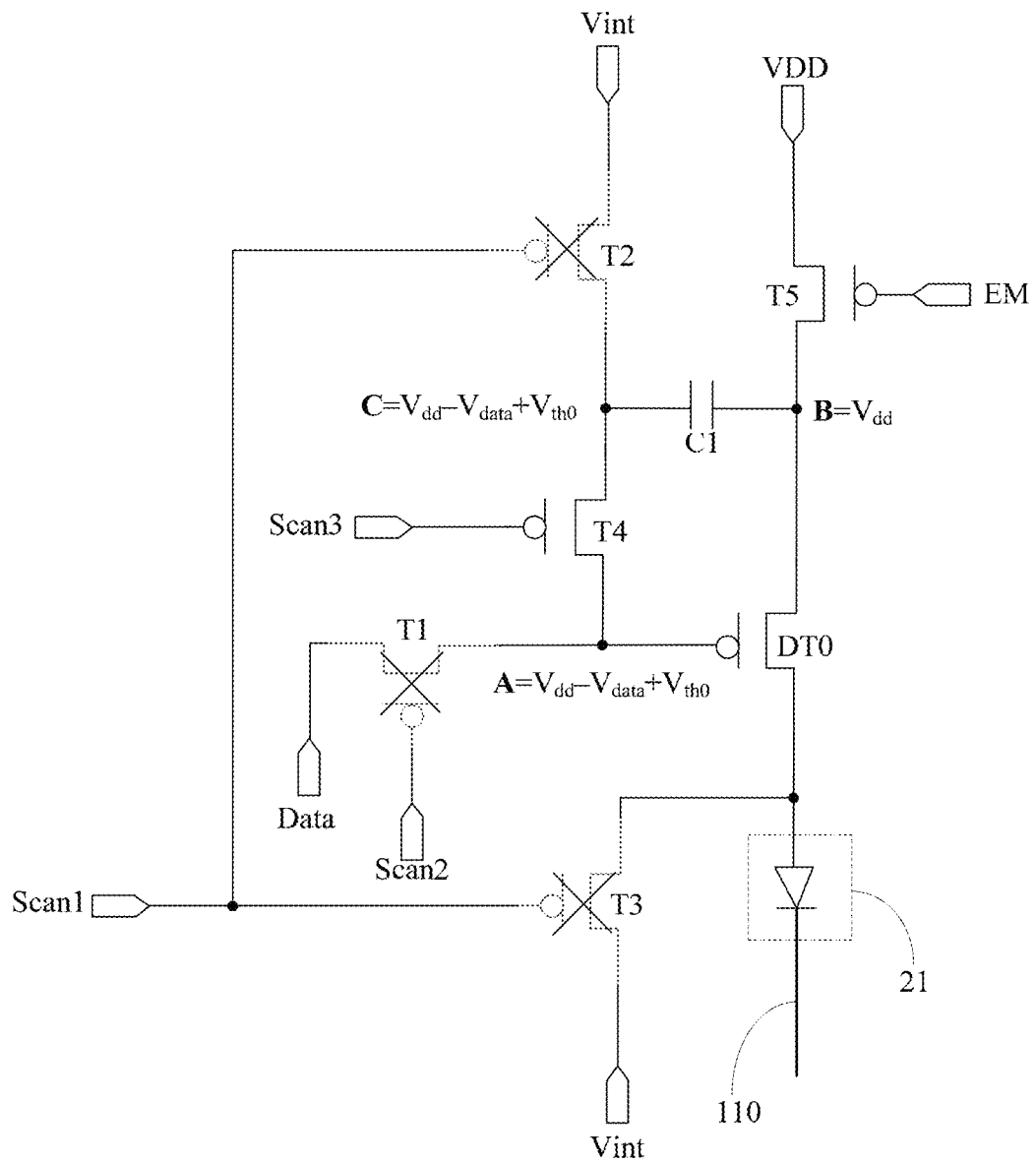

As shown in FIG. 5c, the fourth switching transistor T4, the fifth switching transistor T5 and the driving transistor DT0 are in a turned-on state, the first switching transistor T1, the second switching transistor T2 and the third switching transistor T3 are in a turned-off state. Since the second switching transistor T2 is turned off, the third node C is in a floating state, the first reference signal at the first reference signal terminal VDD is delivered to the second node B through the turned-on fifth switching transistor T5, so that the voltage at the node B changes from $V_{data}-V_{th0}$ in the previous stage to the voltage $V_{dd}$ of the first reference signal, due to a bootstrapping effect of the capacitor C1, the voltage at the third node C jumps as $V_{dd}-VBC=V_{dd}-V_{data}+V_{th0}+V_{ss}$. As described above, it is assumed that $V_{ss}$ is a ground voltage, then the voltage at the third node C jumps as $V_{dd}-V_{data}+V_{th0}$. Since the fourth switching transistor T4 is turned on, a signal at the third node C is delivered to the first node A through the turned-on fourth switching transistor T4, therefore, a voltage VA at the first node A also is $V_{dd}-V_{data}+V_{th0}$. In this stage, the driving transistor DT0 operates in a saturated state, a gate-source voltage of the driving transistor DT0 is $V_{GS}=VA-VB=(V_{dd}-V_{data}+V_{th0})-V_{dd}$, according to characteristics of the current in the statured state, it is known that an operating current $I_{OLED}$ that flows through the driving transistor DT0 and is used to drive the organic light-emitting device 21 to emit light satisfies the following equation: $I_{OLED}=K(V_{GS}-V_{th0})^2=K[(V_{dd}-V_{data}+V_{th0})-V_{dd}-V_{th0}]^2=K\,V_{data}^2$, where K is a structure parameter, which is relatively stable in the same structure and can be considered as a constant quantity. From the above equation, it is seen that the operating current $I_{OLED}$ for the organic light-emitting device 21 is not affected by the threshold voltage $V_{th0}$ of the driving transistor DT0 any more, it is mainly decided by the data signal, an effect caused by threshold voltage drifting, which is due to manufacturing process and long-time operation, to the operating current of the organic light-emitting device can be totally solved, thereby displaying non-uniformity of the display panel is improved.

In the fourth stage (touch display stage), Scan1=1, Scan2=1, Scan3=0, EM=0.

Since signals obtained by superimposing the same touch scanning signal on basis of signals in the third stage are outputted to the respective signal terminals of the sub-pixel circuit and the cathode layer 213, and in this stage, the operating states of the respective modules of the sub-pixel circuit are the same as those of the respective modules in the third stage, that is, the level states of the signals at the respective control terminals of the respective modules are still the same as those in the third stage, thus in this stage, Scan1 still is a high level signal, Scan2 still is a high level signal, Scan3 still is a low level signal, and EM still is a low level signal.

Figure 5D:
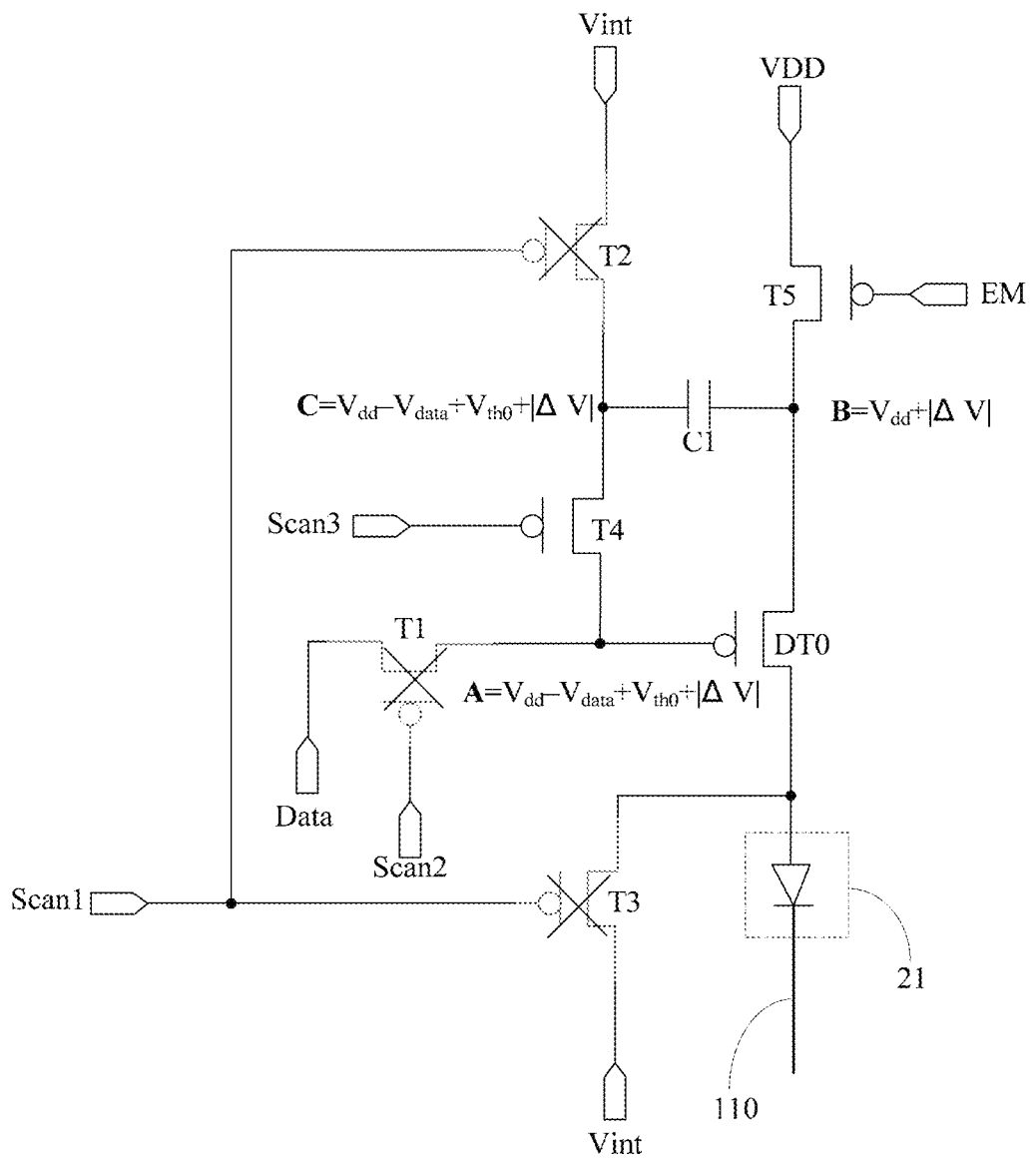

Therefore, as shown in FIG. 5d, the fourth switching transistor T4, the fifth switching transistor T5 and the driving transistor DT0 are in a turned-on state, the first switching transistor T1, the second switching transistor T2 and the third switching transistor T3 are in a turned-off state. Since the second switching transistor T2 is turned off, the third node C is in a floating state, the first reference signal at the first reference signal terminal VDD is delivered to the second node B through the turned-on fifth switching transistor T5, so that the voltage at the node B changes from $V_{dd}$ in the previous stage to the voltage $V_{dd}+|\Delta V|$ of the first reference signal, due to the bootstrapping effect of the capacitor C1, the voltage at the third node C changes as $V_{dd}-V_{data}+V_{th0}+|\Delta V|$, a signal at the third node C is delivered to the first node A through the turned-on fourth switching transistor T4, thus the voltage at the first node A is also $V_{dd}-V_{data}+V_{th0}+|\Delta V|$. In this stage, the driving transistor DT0 operates in a saturated state, a gate-source voltage of the driving transistor DT0 is $V_{GS}=VA-VB=(V_{dd}+|\Delta V|-V_{data}+V_{th0})-(V_{dd}+|\Delta V|)$, according to characteristics of the current in the statured state, an operating current $I_{OLED}$ flowing through the driving transistor DT0 and used to drive the organic light-emitting device 21 to emit light satisfies the following equation: $I_{OLED}=K(V_{GS}-V_{th0})^2=K[(V_{dd}-V_{data}+V_{th0}+|\Delta V|)-V_{dd}+|\Delta V|)-V_{th0}]^2=K\,V_{data}^2$, from which it can be seen that the operating current $I_{OLED}$ for the organic light-emitting device 21 in the fourth stage is consistent with the operating current $I_{OLED}$ for the organic light-emitting device 21 in the third stage, the touch scanning signal $|\Delta V|$ superimposed at each signal terminal of the sub-pixel circuit and the cathode layer brings no affect to the operating current $I_{OLED}$ for the organic light-emitting device 21.

Furthermore, in this stage, the cathode layer is reused as a self-capacitive electrode, the driver chip detects, through the conductive line, a capacitance variation of the cathode layer to determine a touch location. Since the same touch scanning signal is superimposed on the signals of the respective signal terminals and the cathode layer, it is ensured that the cathode layer (i.e., the self-capacitive electrode) is subjected to a fixed capacitance value, accordingly, accuracy of touch determination is ensured, and further, an in-cell touch display panel based on OLED panel is achieved.

It needs to be noted that in FIGS. 5a to 5d, each transistor marked with a symbol "X" is in a turned-off state, each transistor not marked with the symbol "X" is in a turned-on state.

The first embodiment is described with the driving transistor and all the switching transistors in the sub-pixel circuit being as a P-type transistor each as an example.

Figure 6A:
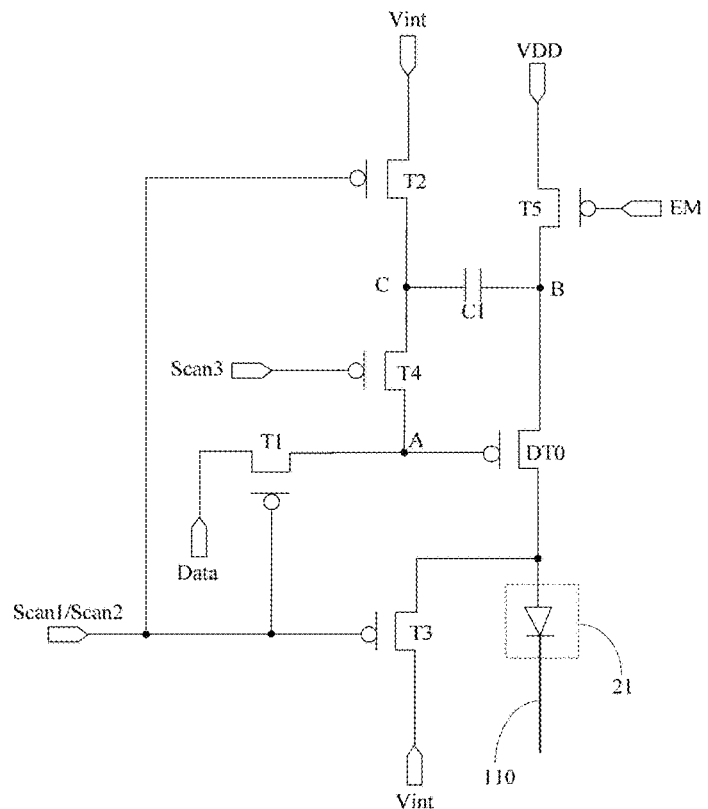
FIGS. 6a to 6e are each a schematic diagram of concrete structure of a sub-pixel circuit provided by an embodiment of the present disclosure.
Figure 7A:
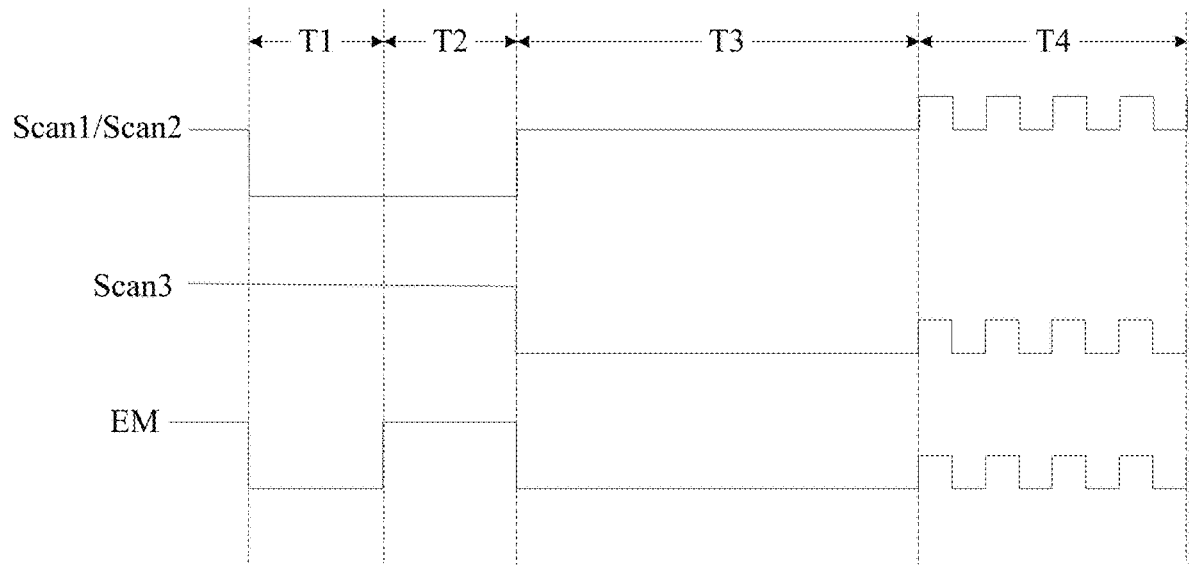
FIGS. 7a to 7e are each a schematic diagram of waveform of input signals to which the sub-pixel circuits shown in FIGS. 6a to 6e correspond.

Further, in the in-cell touch display panel provided above by an embodiment of the present disclosure, as shown in FIG. 6a, the driving transistor DT0 and all the switching transistors (T1, T2, T3, T4, and T5) are a P-type transistor each, the writing control signal terminal Scan2 and the reset control signal terminal Scan1 are connected as a single terminal, a corresponding input timing sequence diagram is as shown in FIG. 7a, specific operating principles are the same as those in the first embodiment, details are not repeated herein.

Figure 6B:
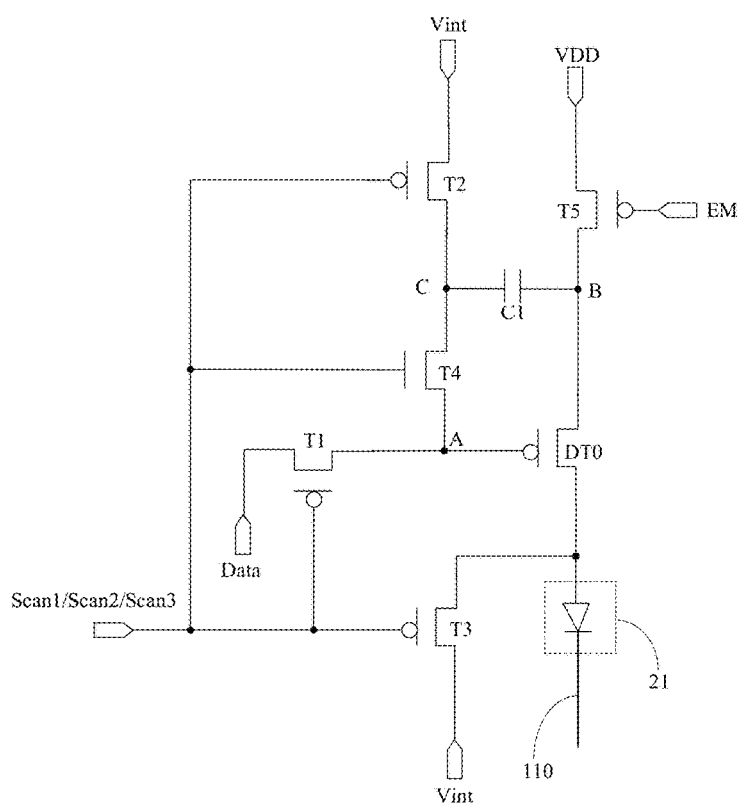
Figure 7B:
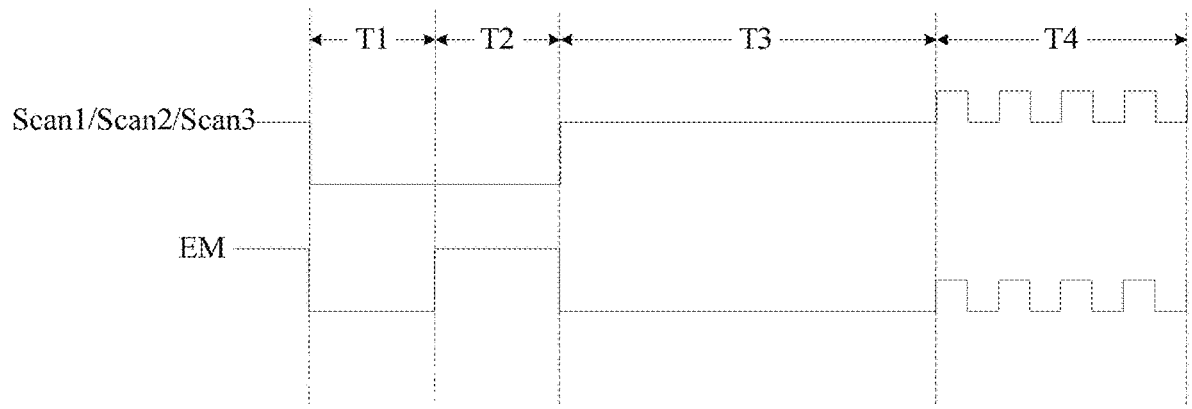

Still further, in the in-cell touch display panel provided above by an embodiment of the present disclosure, as shown in FIG. 6b, the fourth switching transistor T4 is an N-type transistor, the driving transistor DT0 and all the other switching transistors (T1, T2, T3, and T5) are a P-type transistor each, the writing control signal terminal Scan2, the reset control signal terminal Scan1, and the compensation control signal terminal Scan3 are connected as a single terminal, a corresponding input timing sequence diagram is as shown in FIG. 7b, specific operating principles are the same as those in the first embodiment, details are not repeated herein.

Figure 6C:
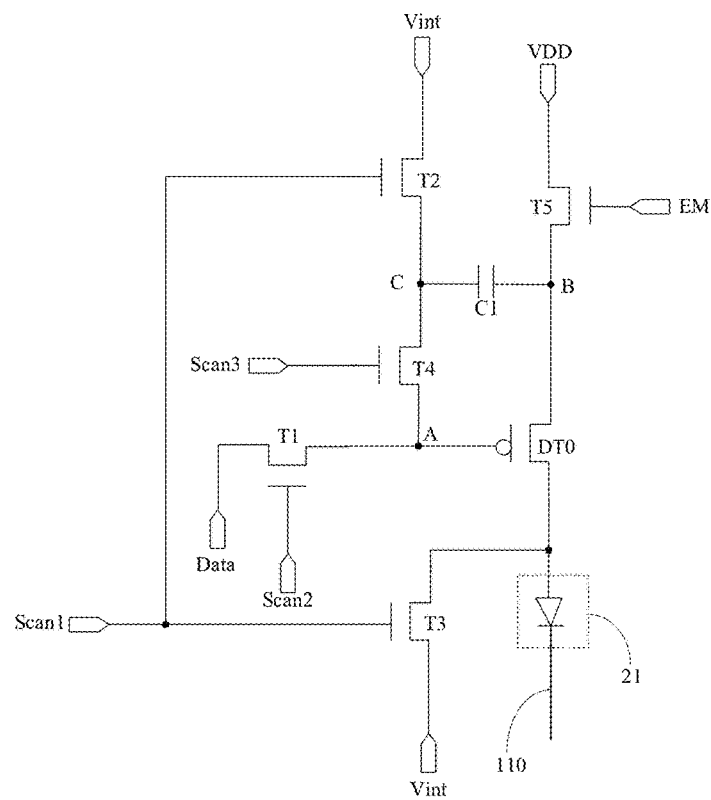
Figure 7C:
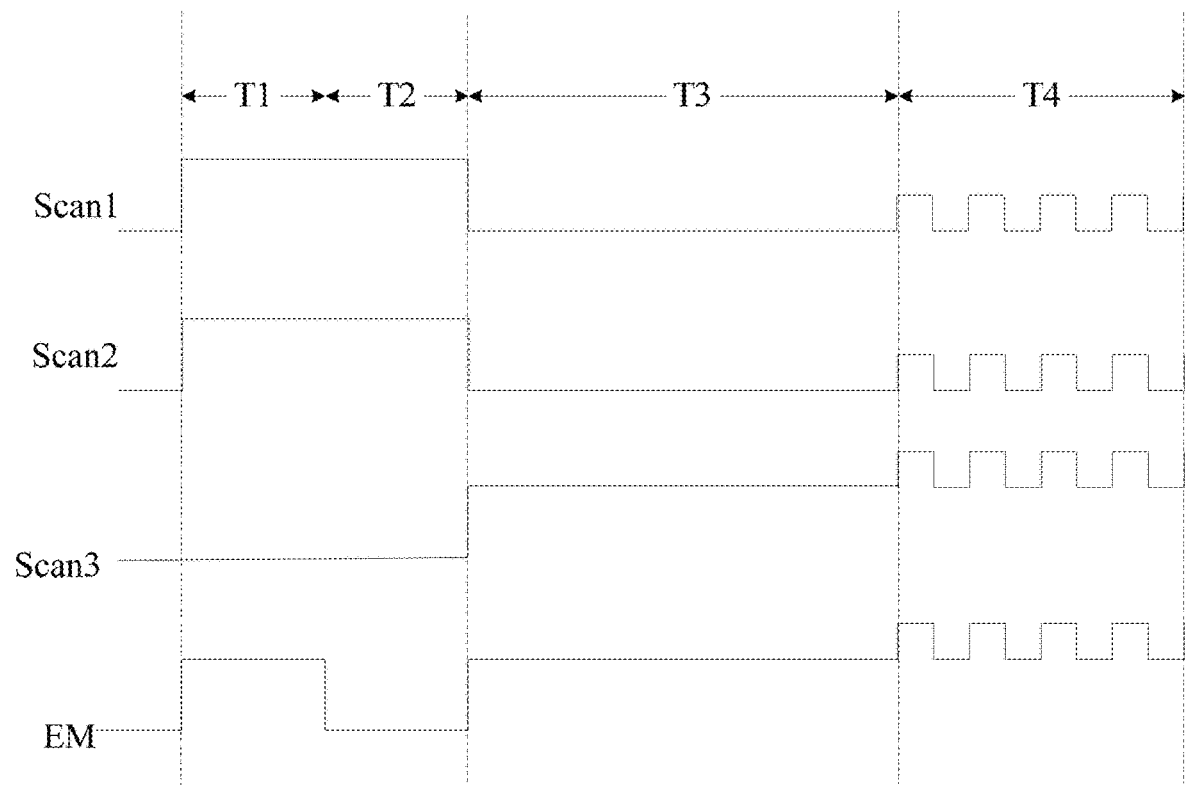

In a specific implementation, in the in-cell touch display panel provided above by an embodiment of the present disclosure, all the switching transistors may also be an N-type transistor each, as shown in FIG. 6c, the driving transistor DT0 is a P-type transistor, the first switching transistor T1, the second switching transistor T2, the third switching transistor T3, the fourth switching transistor T4 and the fifth switching transistor T5 are an N-type transistor each, a corresponding input timing sequence diagram is as shown in FIG. 7c, specific operating principles are the same as those in the first embodiment, details are not repeated herein.

Figure 6D:
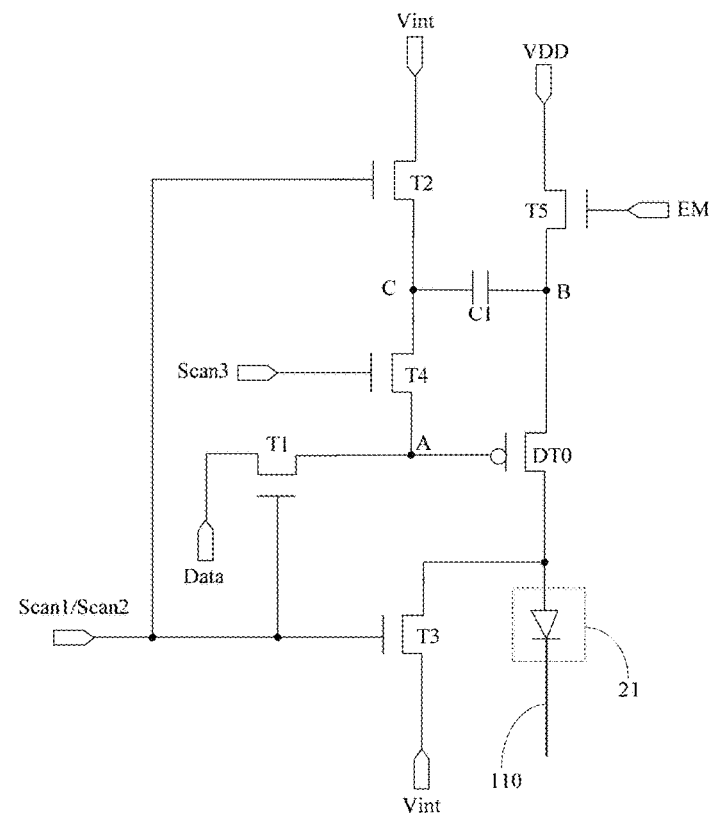
Figure 7D:
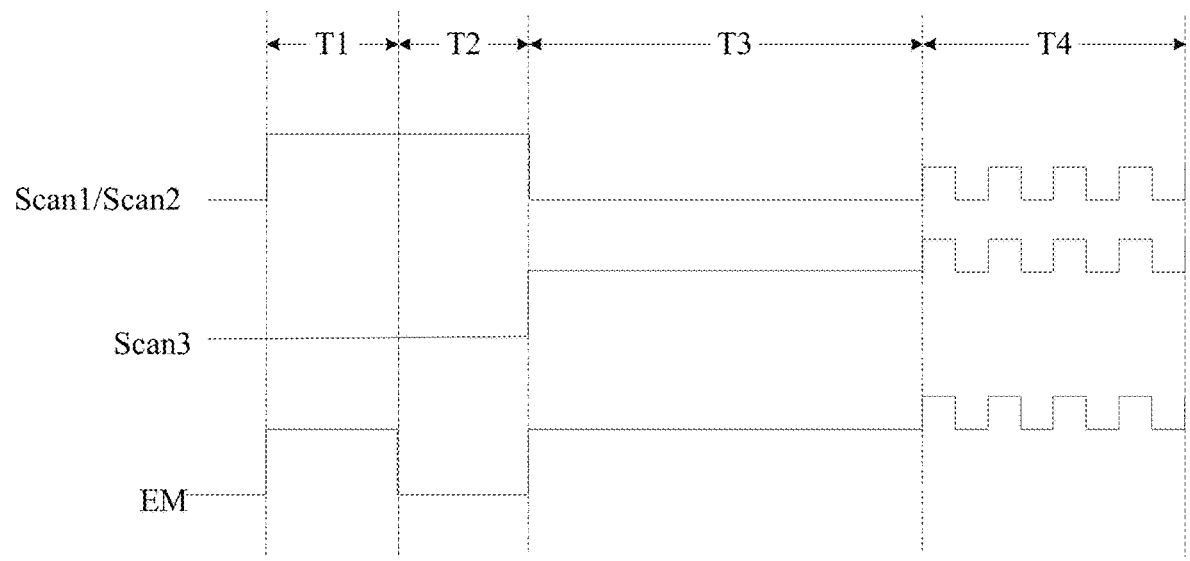

Further, in the in-cell touch display panel provided above by an embodiment of the present disclosure, as shown in FIG. 6d, the driving transistor DT0 is a P-type transistor, all the switching transistors (T1, T2, T3, T4, and T5) are an N-type transistor each, the writing control signal terminal Scan2 and the reset control signal terminal Scan1 are connected as a single terminal, a corresponding input timing sequence diagram is as shown in FIG. 7d, specific operating principles are the same as those in the first embodiment, details are not repeated herein.

Figure 6E:
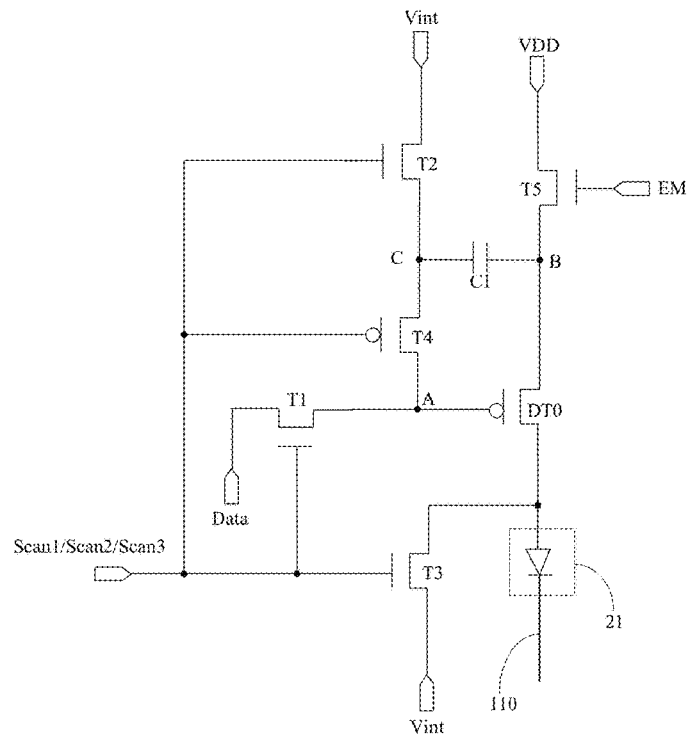
Figure 7E:
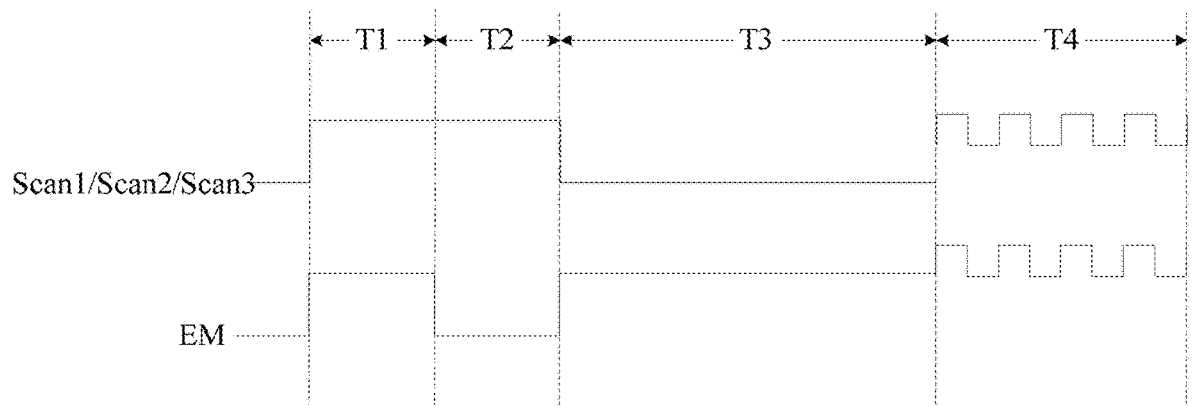

Still further, in the in-cell touch display panel provided above by an embodiment of the present disclosure, as shown in FIG. 6e, the driving transistor DT0 and the fourth switching transistor are a P-type transistor each, all the other switching transistors (T1, T2, T3, and T5) are an N-type transistor each, the writing control signal terminal Scan2, the reset control signal terminal Scan1, and the compensation control signal terminal Scan3 are connected as a single terminal, a corresponding input timing sequence diagram is as shown in FIG. 7e, specific operating principles are the same as those in the first embodiment, details are not repeated herein.

It needs to be noted that, since waveforms of timing sequences of the first reference signal terminal VDD, the second reference signal terminal Vint, the data signal terminal Data, and the signal of the cathode layer 213 in the sub-pixel circuit shown in FIGS. 6a to 6e are the same as the waveforms of timing sequences in the sub-pixel circuit shown in FIG. 4, respectively, thus only the waveforms of timing sequences of the reset control signal terminal Scan1, the writing control signal terminal Scan2, and the light-emitting control signal terminal EM are shown in FIGS. 7a to 7e.

Further, in the in-cell touch display panel provided above by an embodiment of the present disclosure, the sub-pixel circuit is usually located between the anode layer and the array substrate; in order to simplify manufacturing process, the conductive line that is connected with the cathode layer may be disposed in the same layer as the sources, gates, or drains of the transistors in the sub-pixel circuit and other signal lines on the array substrate, in this way, at the time of manufacturing, there is no need to add new manufacturing process, manufacturing can be completed with the only need of changing composition of a corresponding layer, processing steps are simplified, manufacturing cost is saved, and production efficiency is improved.

Preferably, in the in-cell touch display panel provided above by an embodiment of the present disclosure, the sub-pixel circuit is located between the anode layer and the array substrate; the array substrate further includes data lines that connect data signal terminals in the respective sub-pixel circuits to the driver chip; and the conductive lines connected to the cathode layers and the data lines are disposed in the same layer but insulated from each other.

Preferably, in the in-cell touch display panel provided above by an embodiment of the present disclosure, each of the transistors in the sub-pixel circuit includes an active layer, a gate insulating layer, a gate, an insulating layer, a source, and a drain that are arranged in sequence on the array substrate; the data line is disposed in the same layer as the source and the drain; and the conductive line is connected to the cathode layer corresponding thereto through a via hole.

Preferably, the in-cell touch display panel provided above by an embodiment of the present disclosure further comprises: a planarization layer located between a layer where the source and the drain reside and the anode layer, a sub-pixel defining layer located between the cathode layer and the planarization layer and surrounding each light-emitting layer, and a cathode connecting section disposed in the same layer as the anode layer; wherein the cathode connecting section is connected to the conductive line corresponding thereto and connected to the cathode layer through a via hole that penetrates through the planarization layer, the cathode layer is connected to the cathode connecting section corresponding thereto through a via hole that penetrates through the sub-pixel defining layer.

Preferably, the in-cell touch display panel provided above by an embodiment of the present disclosure, a buffer layer located between the sub-pixel circuit and the array substrate is further comprised.

Next, with a specific embodiment, location of the conductive line that is connected to the cathode layer in the in-cell touch display panel provided above by an embodiment of the present disclosure will be described below.

Second Embodiment

Figure 8:
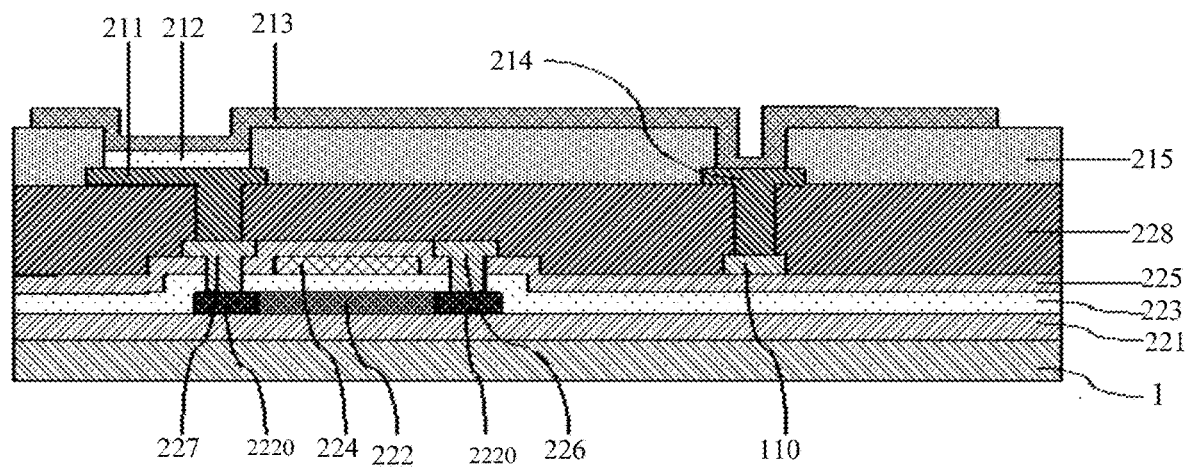
FIG. 8 is a schematic diagram of local structure of an in-cell control display panel provided by a second embodiment of the present disclosure.

With one sub-pixel as an example, as shown in FIG. 8, on the array substrate 1, the following are comprised in sequence: a buffer layer 221, an active layer 222, a gate insulating layer 223, a gate 224, an interlayer insulating layer 225, a source 226 and a drain 227 and a conductive line 110 disposed in the same layer, a planarization layer 228, an anode layer 211 and an cathode connecting portion 214, a light-emitting layer 212, a sub-pixel defining layer 215 surrounding the light emitting layer 212, and a cathode layer 213.

The cathode layer 213 is connected to the cathode connecting portion 214 through a via hole that penetrates through the sub-pixel defining layer 215, the anode layer 211 is connected to the drain 227 through a via hole that penetrate through the planarization layer 228, the cathode connecting portion 214 is connected to the conductive line 110 through a via hole that penetrate through the planarization layer 228, the source 226 and the drain 227 are connected to the active layer 222 through via holes that penetrate through the interlayer insulating layer 225 and via holes that penetrate through the gate insulating layer 223, respectively, and an area 2220 where the active layer 222 contacts the source 226 and the drain 227 has passed through doping processing. FIG. 8 merely shows the active layer 222, the gate 224, the source 226, and the drain 227 of the driving transistor DT0, structure of the switching transistors are the same as that of the driving transistor, repetition is omitted herein.

Specifically, in a specific implementation, in the in-cell touch display panel provided above by an embodiment of the present disclosure, the via hole for connecting the cathode layer 213 and the conductive line 110 is typically disposed between adjacent sub-pixels, in this way, it can avoid that performance of the light-emitting layer is damaged by disposing the via hole in the light-emitting layer.

Figure 9A:
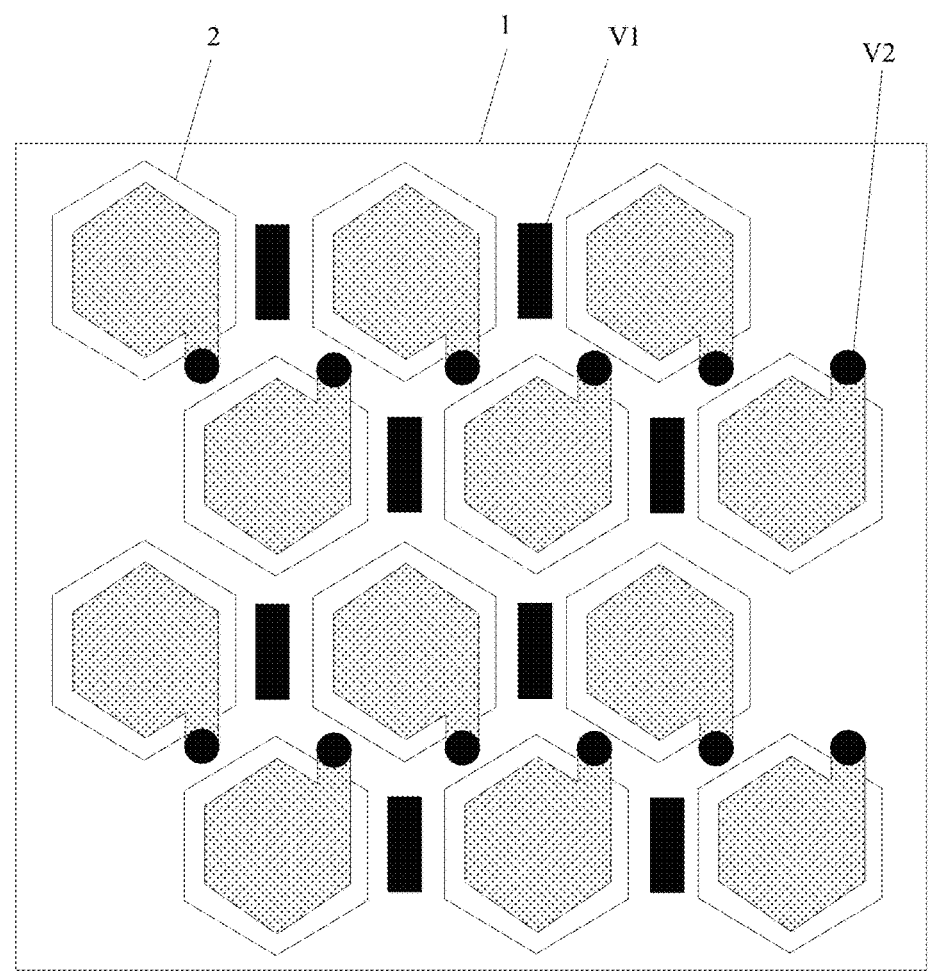
FIGS. 9a to 9b are each a schematic diagram of arrangement of sub-pixels of an in-cell touch display panel provided by an embodiment of the present disclosure.
Figure 9B:
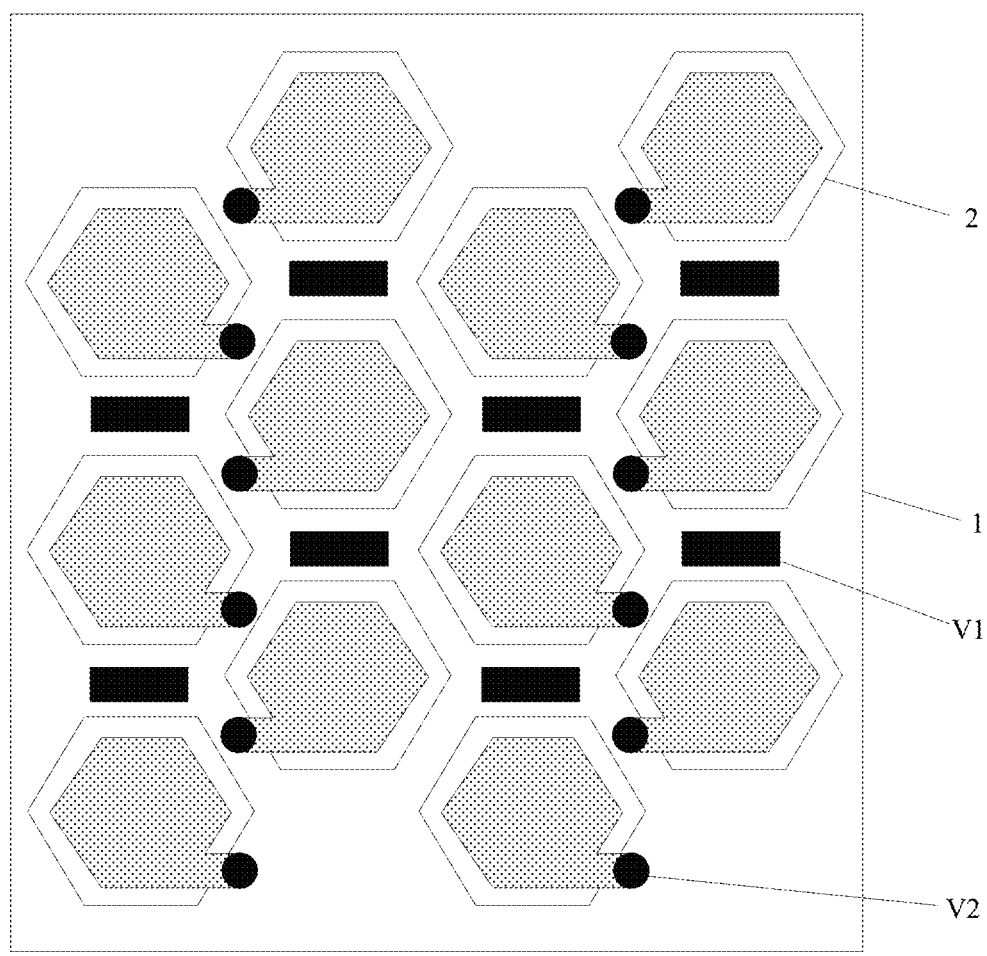

Further, in a specific implementation, in the in-cell touch display panel provided above by an embodiment of the present disclosure, as shown in FIGS. 9a and 9b, each sub-pixel 2 is of a hexagonal shape, and all the sub-pixels 2 are arranged regularly on the array substrate 1.

As shown in FIG. 9a, respective sub-pixels 2 are arranged side by side in a row direction, sub-pixels 2 at corresponding positions in two adjacent rows of sub-pixels 2 show a misaligned arrangement in a column direction, and in each row of sub-pixels 2, a via hole V1 for connecting the cathode layer 213 and the conductive line 110 is disposed between two adjacent sub-pixels 2; a via hole V2 for connecting the anode layer 211 and the drain 227 is disposed in a gap between two adjacent rows of sub-pixels 2.

Alternatively, as shown in FIG. 9b, respective sub-pixels 2 are arranged side by side in a column direction, sub-pixels 2 at corresponding positions in two adjacent columns of sub-pixels 2 show a misaligned arrangement in a row direction, and in each column of sub-pixels 2, a via hole V1 for connecting the cathode layer 213 and the conductive line 110 is disposed between two adjacent sub-pixels 2; a via hole V2 for connecting the anode layer 211 and the drain 227 is disposed in a gap between two adjacent columns of sub-pixels 2.

Figure 10:
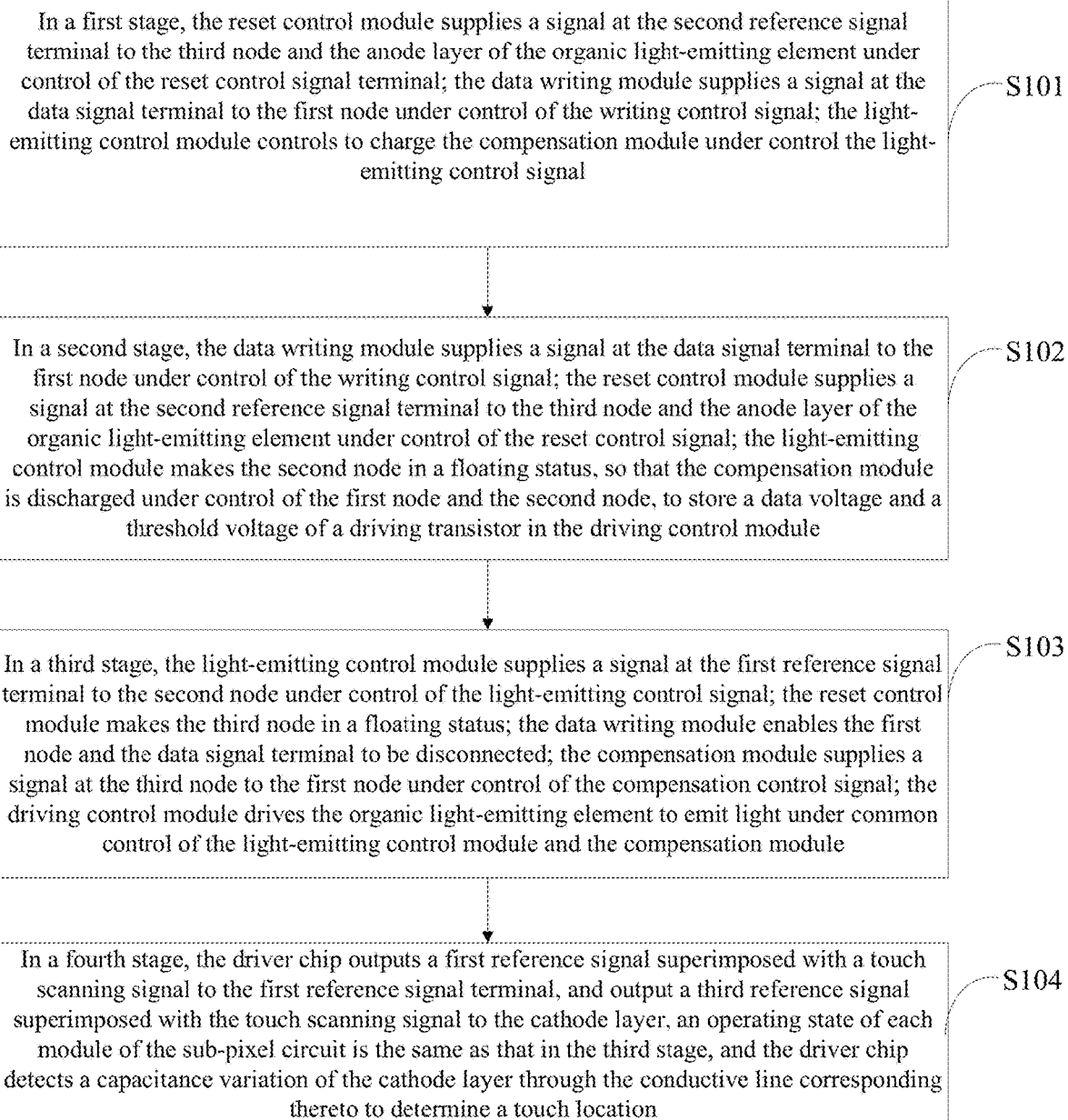
FIG. 10 is a schematic diagram of flowchart of a driving method for the in-cell touch display panel provided by an embodiment of the present disclosure.

Based on the same inventive concept, in an embodiment of the present disclosure, there is further provided a driving method for the in-cell touch display panel as described above; as shown in FIG. 10, as for each sub-pixel, four stages may be included within one frame.

S101: in a first stage (resetting and charging stage), as for the sub-pixel circuit of the sub-pixel, the driver chip outputs a reset control signal to the reset control signal terminal therein, outputs a writing control signal to the writing control signal terminal therein, outputs a data signal to the data signal terminal therein, outputs a light-emitting control signal to the light-emitting control signal terminal therein, outputs a first reference signal to the first reference signal terminal therein, outputs a second reference signal to the second reference signal terminal therein, and outputs, through a conductive line corresponding thereto, a third reference signal to the cathode layer of the organic light-emitting device in the sub-pixel; the reset control module supplies a signal at the second reference signal terminal to the third node and the anode layer of the organic light-emitting element; the data writing module supplies a signal at the data signal terminal to the first node; the light-emitting control module supplies a signal at the first reference signal terminal to the second node and charges the compensation module.

S102: in a second stage (discharging stage), as for the sub-pixel circuit of the sub-pixel, the driver chip outputs a writing control signal to the writing control signal terminal therein, outputs a data signal to the data signal terminal therein, outputs a reset control signal to the reset control signal terminal therein, outputs a first reference signal to the first reference signal terminal therein, outputs a second reference signal to the second reference signal terminal therein, and outputs, through a conductive line corresponding thereto, a third reference signal to the cathode layer of the organic light-emitting device in the sub-pixel; the data writing module supplies a signal at the data signal terminal to the first node; the reset control module supplies a signal at the second reference signal terminal to the third node and the anode layer of the organic light-emitting element; the compensation module is discharged, until the compensation module stores a threshold voltage of a driving transistor in the driving control module.

S103: in a third stage (light-emitting display stage), as for the sub-pixel circuit of the sub-pixel, the driver chip outputs a light-emitting control signal to the light-emitting control signal terminal therein, outputs a compensation control signal to the compensation control signal terminal therein, outputs a first reference signal to the first reference signal terminal therein, outputs a second reference signal to the second reference signal terminal therein, and outputs, through a conductive line corresponding thereto, a third reference signal to the cathode layer of the organic light-emitting device in the sub-pixel; the light-emitting control module supplies a signal at the first reference signal terminal to the second node; the third node is in a floating state; the compensation module maintains a voltage difference between the second node and the third node as a fixed value, and supplies a signal at the third node to the first node; the driving control module drives the organic light-emitting element to emit light under common control of the light-emitting control module and the compensation module.

S104: in a fourth stage (touch display stage), the driver chip outputs signals to the respective signal terminals of the sub-pixel circuit and the cathode layer, the signal being obtained by superimposing the same touch scanning signal on basis of the signals outputted to the respective signal terminals and the cathode layer in the third stage, an operating state of each module of the sub-pixel circuit is the same as that in the third stage, and the driver chip detects a capacitance variation of the cathode layer through the conductive line corresponding thereto to determine a touch location.

Based on the same inventive concept, in an embodiment of the present disclosure, there is further provided a display device comprising the in-cell touch display panel as provided above by the embodiments of the present disclosure, the display device may be: mobile phone, tablet computer, television, display, notebook computer, digital frame, navigator and any other products or components having a display function. As for implementation of said display device, reference may be made to the embodiments of the in-cell touch display panel described above, repetition is omitted herein.

In the in-cell touch display panel, the driving method thereof, and the display device provided above by the embodiments of the present disclosure, at least two sub-pixels are a sub-pixel group, cathode layers of different sub-pixel groups are independent of each other, which is equivalent to that the cathode layer set as a whole surface in the prior art is segmented, one sub-pixel group corresponds to one segmented cathode layer, the cathode layers of the respective sub-pixel groups are connected through respective conductive lines to the driver chip, so that the cathode layer is reused as a self-capacitive touch control electrode, the driver chip detects a capacitance variation of the cathode layer through the conductive line corresponding to the cathode layer to determine a touch location, thus achieving the touch control function. In the in-cell touch display panel, the signals outputted by the drive chip to the respective signal terminals of the sub-pixel circuit and the cathode layer in the fourth stage are obtained by superimposing the same touch scanning signal on basis of the signals outputted to the respective signal terminals and the cathode layer in the third stage, so that the operating state of each module in the sub-pixel circuit is the same as that in the third stage (i.e., the light-emitting display stage), which ensures normal display, therefore, an in-cell touch display panel based on OLED panel is achieved.

Obviously, those skilled in the art can make various modifications and variations to the present disclosure without departing from the spirit and scope thereof. Thus, if these modifications and variations of the present disclosure are within the scope of the claims of the application as well as their equivalents, the present disclosure is also intended to include these modifications and variations.

The present application claims priority of the Chinese Patent Application No. 201510350194.2, entitled "IN-CELL TOUCH DISPLAY SCREEN, DRIVING METHOD THEREOF AND DISPLAY DEVICE" filed on Jun. 23, 2015, the entire disclosure of which is hereby incorporated in full text by reference as part of the present application.

What is claimed is:

1. An in-cell touch display panel, comprising:
   an array substrate;
   a plurality of sub-pixels arranged on the array substrate, each of the plurality of sub-pixels including an organic light-emitting element and a sub-pixel circuit electrically connected to the organic light-emitting element, the organic light-emitting element including an anode layer, a light-emitting layer, and a cathode layer that are arranged in sequence on the array substrate; and
   a driver chip configured to output signals to at least one signal terminal of respective sub-pixel circuits and to at least one cathode layer of a sub-pixel group within one frame, the one frame comprising a light-emitting display stage and a touch display stage, wherein
   the sub-pixel group comprises at least two sub-pixels, cathode layers pertaining to different sub-pixel groups are independent of each other, and
   wherein the sub-pixel circuit includes: a data writing sub-circuit, a compensation sub-circuit, a reset control sub-circuit, a light-emitting control sub-circuit, a driving control sub-circuit, a data signal terminal, a writing control signal terminal, a reset control signal terminal, a light-emitting control signal terminal, a compensation control signal terminal, a first reference signal terminal, and a second reference signal terminal, during the light-emitting display stage, the driver chip outputs a light-emitting control signal to the light-emitting control signal terminal, outputs a compensation control signal to the compensation control signal terminal, outputs a first reference signal to the first reference signal terminal, outputs a second reference signal to the second reference signal terminal, and outputs a third reference signal to the cathode layer of the organic light-emitting element;

during the touch display stage, the driver chip outputs the same light-emitting control signal and a touch scanning signal to the light-emitting control signal terminal, outputs the same compensation control signal and the touch scanning signal to the compensation control signal terminal, outputs the same first reference signal and the touch scanning signal to the first reference signal terminal, outputs the same second reference signal and the touch scanning signal to the second reference signal terminal, and outputs the same third reference signal and the touch scanning signal to the cathode layer of the organic light-emitting element, so that operating states in the sub-pixel circuit during the touch display stage are the same as operating states in the sub-pixel circuit during the light-emitting display stage, that is, level states of signals at respective signal terminals of the respective sub-circuits during the touch display stage are the same as those during the light-emitting display stage; and the driver chip detects a capacitance variation of the at least one cathode layer through a conductive line corresponding thereto to determine a touch location, in which the at least one cathode layer serves as a self-capacitive electrode.

2. The in-cell touch display panel according to claim 1, wherein:

an input terminal of the data writing sub-circuit is connected to the data signal terminal, a control terminal thereof is connected to the writing control signal terminal, and an output terminal thereof is connected to a first node, the first node being a connection point between the data writing sub-circuit and the driving control sub-circuit;

an input terminal of the light-emitting control sub-circuit is connected to the first reference signal terminal, a control terminal thereof is connected to the light-emitting control signal terminal, and an output terminal thereof is connected to a second node, the second node being a connection node between the light-emitting control sub-circuit and the driving control sub-circuit;

an input terminal of the reset control sub-circuit is connected to the second reference signal terminal, a control terminal thereof is connected to the reset control signal terminal, a first output terminal thereof is connected to a third node, and a second output terminal thereof is connected to an output terminal of the driving control sub-circuit and the anode layer of the organic light-emitting element corresponding thereto, the third node being a connection point between the reset control sub-circuit and the compensation sub-circuit;

a first input terminal of the compensation sub-circuit is connected to the second node, a second input terminal thereof is connected to the third node, a control terminal thereof is connected to the compensation control signal terminal, and an output terminal thereof is connected to the first node; and an input terminal of the driving control sub-circuit is connected to the second node, a control terminal thereof is connected to the first node, an output terminal thereof is connected to the anode layer of the organic light-emitting element.

3. The in-cell touch display panel according to claim 2, wherein the reset control sub-circuit is configured to supply, under control of the reset control signal terminal, a signal at the second reference signal terminal to the third node and to the anode layer of the organic light-emitting element;

the data writing sub-circuit is configured to supply, under control of the writing control signal terminal, a signal at the data signal terminal to the first node;

the light-emitting control sub-circuit is configured to supply, under control the light-emitting control signal terminal, a signal at the first reference signal terminal to the second node;

the compensation sub-circuit is configured to store a data voltage and a threshold voltage of the driving control sub-circuit, and supply, under control of the compensation control signal terminal, a signal at the third node to the first node, so as to compensate for an effect of the threshold voltage of the driving control sub-circuit on a current that flows through the organic light-emitting element; and the driving control sub-circuit is configured to drive, under common control of the light-emitting control sub-circuit and the compensation sub-circuit, the organic light-emitting element to emit light.

4. The in-cell touch display panel according to claim 3, wherein:

the data writing sub-circuit includes: a first switching transistor having a gate that serves as the control terminal of the data writing sub-circuit, a source that serves as the input terminal of the data writing sub-circuit, and a drain that serves as the output terminal of the data writing sub-circuit; and the driving control sub-circuit includes: a driving transistor having a gate that serves as the control terminal of the driving control sub-circuit, a source that serves as the input terminal of the driving control sub-circuit, and a drain that serves as the output terminal of the driving control sub-circuit.

5. The in-cell touch display panel according to claim 3, wherein the reset control sub-circuit includes a second switching transistor and a third switching transistor;

a gate of the second switching transistor is connected to a gate of the third switching transistor and serves as the control terminal of the reset control sub-circuit, a source of the second switching transistor serves as the input terminal of the reset control sub-circuit, and a drain of the second switching transistor serves as the first output terminal of the reset control sub-circuit; a source of the third switching transistor serves as the input terminal of the reset control sub-circuit, and a drain of the third switching transistor serves as the second output terminal of the reset control sub-circuit; and the light-emitting control sub-circuit includes: a fifth switching transistor having a gate that serves as the control terminal of the light-emitting control sub-circuit, a source that serves as the input terminal of the light-emitting control sub-circuit, and a drain that serves as the output terminal of the light-emitting control sub-circuit.

6. The in-cell touch display panel according to claim 3, wherein the compensation sub-circuit includes: a fourth switching transistor and a capacitor, wherein
   a gate of the fourth switching transistor serves as the control terminal of the compensation sub-circuit, a source thereof is connected to one terminal of the capacitor and serves as the second input terminal of the compensation sub-circuit, and a drain thereof serves as the output terminal of the compensation sub-circuit, and
   the other terminal of the capacitor serves as the first input terminal of the compensation sub-circuit.

7. The in-cell touch display panel according to claim 6, wherein the sub-pixel circuit is located between the anode layer and the array substrate,
   the array substrate further includes data lines that connect respective data signal terminals in the respective sub-pixel circuits to the driver chip, and
   the conductive line and the data lines are disposed in a same layer but insulated from each other.

8. The in-cell touch display panel according to claim 7, wherein transistors in the sub-pixel circuit include an active layer, a gate insulating layer, a gate, an insulating layer, and a source and a drain that are arranged in sequence on the array substrate, wherein
   the data lines are disposed in a same layer as the source and the drain, and
   the conductive line is connected to the cathode layer corresponding thereto through a via hole.

9. The in-cell touch display panel according to claim 8, wherein each of the sub-pixel circuits further comprises:
   a planarization layer located between a layer where the source and the drain reside and the anode layer;
   a sub-pixel defining layer located between the cathode layer and the planarization layer and surrounding the light-emitting layer; and
   a cathode connecting section disposed in a same layer as the anode layer, wherein the cathode connecting section is connected to the conductive line corresponding thereto through a via hole that penetrates through the planarization layer, and the cathode layer is connected to the cathode connecting section corresponding thereto through a via hole that penetrates through the sub-pixel defining layer.

10. The in-cell touch display panel according to claim 8, wherein each sub-pixel is of a hexagonal shape, and all of the sub-pixels are arranged regularly on the array substrate, and wherein:
    the sub-pixels are arranged side by side in a row direction, the sub-pixels at corresponding positions in two adjacent rows of sub-pixels show a misaligned arrangement in a column direction, and, in each row of sub-pixels, a via hole for connecting the cathode layer and the conductive line is disposed between two adjacent sub-pixels, and a via hole for connecting the anode layer and the drain is disposed in a gap between the two adjacent rows of sub-pixels; or
    the sub-pixels are arranged side by side in the column direction, the sub-pixels at corresponding positions in two adjacent columns of sub-pixels show a misaligned arrangement in the row direction, and, in each column of sub-pixels, a via hole for connecting the cathode layer and the conductive line is disposed between two adjacent sub-pixels, and a via hole for connecting the anode layer and the drain is disposed in a gap between the two adjacent columns of sub-pixels.

11. The in-cell touch display panel according to claim 2, wherein
    the cathode layer of each of the sub-pixel groups is connected to the driver chip through a conductive line corresponding thereto, and
    the driver chip is further configured to, as for each sub-pixel circuit, within one frame:
      in a resetting and charging stage, output a light-emitting control signal to the light-emitting control signal terminal, output a reset control signal to the reset control signal terminal, output a writing control signal to the writing control signal terminal, and output a data signal to the data signal terminal;
      in a discharging stage, output a reset control signal to the reset control signal terminal, output a writing control signal to the writing control signal terminal, and output a data signal to the data signal terminal;
      in the light-emitting display stage, output a light-emitting control signal to the light-emitting control signal terminal, output a compensation control signal to the compensation control signal terminal, and output a third reference signal to the cathode layer of the organic light-emitting element in the sub-pixel through the conductive line corresponding thereto; and
      in the touch display stage, output signals to respective signal terminals of the sub-pixel circuit and the cathode layer, wherein the signals are based on signals outputted to the respective signal terminal and the cathode layer in the light-emitting display stage, and detect a capacitance variation of the cathode layer through the conductive line corresponding thereto to determine a touch location.

12. A driving method for the in-cell touch display panel according to claim 2, as for each sub-pixel, within one frame:
    in a resetting and charging stage, the reset control sub-circuit supplies a signal at the second reference signal terminal to the third node and to the anode layer of the organic light-emitting element under control of a reset control signal, the data writing sub-circuit supplies a signal at the data signal terminal to the first node under control of a writing control signal, and the light-emitting control sub-circuit controls to charge the compensation sub-circuit under control a light-emitting control signal;
    in a discharging stage, the data writing sub-circuit supplies a signal at the data signal terminal to the first node under control of the writing control signal, the reset control sub-circuit supplies a signal at the second reference signal terminal to the third node and the anode layer of the organic light-emitting element under control of the reset control signal, and the light-emitting control sub-circuit makes the second node in a floating state, so that the compensation sub-circuit is discharged under control of the first node and the second node, to store a data voltage and a threshold voltage of a driving transistor in the driving control sub-circuit;
    in a light-emitting display stage, the light-emitting control sub-circuit supplies a signal at the first reference signal terminal to the second node under control of the light-emitting control signal, the reset control sub-circuit makes the third node in a floating state, the data writing sub-circuit enables the first node and the data signal terminal to be disconnected, the compensation sub-circuit supplies a signal at the third node to the first node under control of a compensation control signal, and the driving control sub-circuit drives the organic light-emitting element to emit light under common control of the light-emitting control sub-circuit and the compensation sub-circuit; and in a touch display stage, the driver chip outputs a first reference signal superimposed with a touch scanning signal to the first reference signal terminal, and outputs a third reference signal superimposed with the touch scanning signal to the cathode layer, an operating state of each sub-circuit of the sub-pixel circuit is the same as that in the light-emitting display stage, and the driver chip detects a capacitance variation of the cathode layer through a conductive line corresponding thereto to determine a touch location, in which the cathode layer serves as a self-capacitive electrode.

13. The driving method of claim 12, wherein the cathode layer of each of the sub-pixel groups is connected to the driver chip through a conductive line corresponding thereto, and the driver chip is further configured to, as for each sub-pixel circuit, within one frame:

in the resetting and charging stage, output a light-emitting control signal to the light-emitting control signal terminal, output a reset control signal to the reset control signal terminal, output a writing control signal to the writing control signal terminal, and output a data signal to the data signal terminal;

in the discharging stage, output a reset control signal to the reset control signal terminal, output a writing control signal to the writing control signal terminal, and output a data signal to the data signal terminal;

in the light-emitting display stage, output a light-emitting control signal to the light-emitting control signal terminal, output the compensation control signal to the compensation control signal terminal, and output the third reference signal to the cathode layer of the organic light-emitting element in the sub-pixel through the conductive line corresponding thereto; and in the touch display stage, output signals to respective signal terminals of the sub-pixel circuit and the cathode layer, wherein the signals are based on signals outputted to the respective signal terminal and the cathode layer in the light-emitting display stage, and detect a capacitance variation of the cathode layer through the conductive line corresponding thereto to determine a touch location, in which the cathode layer serves as a self-capacitive electrode.

14. A display device comprising the in-cell touch display panel according to claim 1.

15. The display device of claim 14, wherein each of the plurality of sub-pixels further includes a sub-pixel circuit electrically connected to the organic light-emitting element, wherein:

an input terminal of the data writing sub-circuit is connected to the data signal terminal, a control terminal thereof is connected to the writing control signal terminal, and an output terminal thereof is connected to a first node, the first node being a connection point between the data writing sub-circuit and the driving control sub-circuit;

an input terminal of the light-emitting control sub-circuit is connected to the first reference signal terminal, a control terminal thereof is connected to the light-emitting control signal terminal, and an output terminal thereof is connected to a second node, the second node being a connection node between the light-emitting control sub-circuit and the driving control sub-circuit;

an input terminal of the reset control sub-circuit is connected to the second reference signal terminal, a control terminal thereof is connected to the reset control signal terminal, a first output terminal thereof is connected to a third node, and a second output terminal thereof is connected to an output terminal of the driving control sub-circuit and the anode layer of the organic light-emitting element corresponding thereto, the third node being a connection point between the reset control sub-circuit and the compensation sub-circuit;

a first input terminal of the compensation sub-circuit is connected to the second node, a second input terminal thereof is connected to the third node, a control terminal thereof is connected to the compensation control signal terminal, and an output terminal thereof is connected to the first node; and an input terminal of the driving control sub-circuit is connected to the second node, a control terminal thereof is connected to the first node, an output terminal thereof is connected to the anode layer of the organic light-emitting element.

16. The display device of claim 15, wherein the reset control sub-circuit is configured to supply, under control of the reset control signal terminal, a signal at the second reference signal terminal to the third node and the anode layer of the organic light-emitting element;

the data writing sub-circuit is configured to supply, under control of the writing control signal terminal, a signal at the data signal terminal to the first node;

the light-emitting control sub-circuit is configured to supply, under control the light-emitting control signal terminal, a signal at the first reference signal terminal to the second node;

the compensation sub-circuit is configured to store a data voltage and a threshold voltage of the driving control sub-circuit, and supply, under control of the compensation control signal terminal, a signal at the third node to the first node, so as to compensate for an effect of the threshold voltage of the driving control sub-circuit on a current that flows through the organic light-emitting element; and the driving control sub-circuit is configured to drive, under common control of the light-emitting control sub-circuit and the compensation sub-circuit, the organic light-emitting element to emit light.

17. The display device of claim 15, wherein the cathode layer of each of the sub-pixel groups is connected to the driver chip through a conductive line corresponding thereto, and the driver chip is further configured to, as for each sub-pixel circuit, within one frame:

in a resetting and charging stage, output a light-emitting control signal to the light-emitting control signal terminal, output a reset control signal to the reset control signal terminal, output a writing control signal to the writing control signal terminal, and output a data signal to the data signal terminal;

in a discharging stage, output a reset control signal to the reset control signal terminal, output a writing control signal to the writing control signal terminal, and output a data signal to the data signal terminal;

in the light-emitting display stage, output a light-emitting control signal to the light-emitting control signal terminal, output a compensation control signal to the compensation control signal terminal, and output a third reference signal to the cathode layer of the organic light-emitting element in the sub-pixel through the conductive line corresponding thereto; and in the touch display stage, output signals to respective signal terminals of the sub-pixel circuit and the cathode layer, wherein the signals are based on signals outputted to the respective signal terminal and the cathode layer in the light-emitting display stage, and detect a capacitance variation of the cathode layer through the conductive line corresponding thereto to determine a touch location, in which the cathode layer serves as a self-capacitive electrode.

\* \* \* \* \*